(12) United States Patent
Hayashi

(10) Patent No.: US 11,081,627 B2
(45) Date of Patent: Aug. 3, 2021

(54) SEMICONDUCTOR DEVICE AND METHOD FOR MANUFACTURING THE SAME

(71) Applicant: NICHIA CORPORATION, Anan (JP)

(72) Inventor: Hidehisa Hayashi, Anan (JP)

(73) Assignee: NICHIA CORPORATION, Anan (JP)

( * ) Notice: Subject to any disclaimer, the term of this patent is extended or adjusted under 35 U.S.C. 154(b) by 115 days.

(21) Appl. No.: 16/557,226

(22) Filed: Aug. 30, 2019

(65) Prior Publication Data
US 2020/0075819 A1 Mar. 5, 2020

(30) Foreign Application Priority Data
Aug. 31, 2018 (JP) .............................. JP2018-163380

(51) Int. Cl.
*H01L 33/54* (2010.01)
*H01L 33/62* (2010.01)

(52) U.S. Cl.
CPC .............. *H01L 33/54* (2013.01); *H01L 33/62* (2013.01); *H01L 2933/005* (2013.01); *H01L 2933/0066* (2013.01)

(58) Field of Classification Search
CPC . H01L 33/54; H01L 33/62; H01L 2933/0066; H01L 2933/005; H01L 33/486
See application file for complete search history.

(56) References Cited

U.S. PATENT DOCUMENTS

| 5,853,771 A | 12/1998 | Matsumoto |
| 2008/0157113 A1 | 7/2008 | Hayashi |
| 2016/0118558 A1* | 4/2016 | Abe ..................... H01L 33/60 257/98 |
| 2016/0233390 A1* | 8/2016 | Hayashi ............... H01L 33/20 |
| 2016/0240518 A1* | 8/2016 | Hayashi .............. H01L 25/0753 |
| 2017/0087751 A1 | 3/2017 | Tanaka et al. |

FOREIGN PATENT DOCUMENTS

| JP | H11-058449 A | 3/1999 |
| JP | H11-087780 A | 3/1999 |
| JP | 2000-027761 A | 1/2000 |
| JP | 2003-168824 A | 6/2003 |
| JP | 2008-166535 A | 7/2008 |
| JP | 2012-15176 A | 1/2012 |
| JP | 2017-65010 A | 4/2017 |

* cited by examiner

Primary Examiner — Victor A Mandala
(74) Attorney, Agent, or Firm — Global IP Counselors, LLP

(57) ABSTRACT

A semiconductor device includes a lead, a semiconductor element, a first resin molded body, and a second resin molded body. The lead is a thin metal plate having a first surface and a second surface on an opposite side from the first surface. The semiconductor element is fixed to the lead. The first resin molded body is arranged on the first surface of the lead. An outer shape of the first resin molded body is left and right symmetric with respect to a center axis passing through a center of the first resin molded body in a plan view. The second resin molded body is arranged on the second surface of the lead. An outer shape of the second resin molded body is left and right asymmetric with respect to a center axis passing through a center of the second resin molded body in the plan view.

8 Claims, 13 Drawing Sheets

SEMICONDUCTOR DEVICE AND METHOD FOR MANUFACTURING THE SAME

CROSS-REFERENCE TO RELATED APPLICATIONS

This application claims priority to Japanese Patent Application No. 2018-163380 filed on Aug. 31, 2018. The entire disclosure of Japanese Patent Application No. 2018-163380 is hereby incorporated herein by reference.

BACKGROUND OF THE INVENTION

Field of the Invention

The present invention relates to a semiconductor device and to a method for manufacturing the semiconductor device.

Description of the Related Art

In general, a semiconductor device is manufactured by fixing a semiconductor element to a resin molded body formed by pouring a resin into a die (an upper die and a lower die) in a state in which a lead frame including a portion that will become a lead electrode is sandwiched from above and below by the dies.

In the process of manufacturing such a semiconductor device, it is important to accurately position and mold the first resin molded body and the second resin molded body disposed so as to sandwich the lead frame.

For example, Japanese Laid-Open Patent Application Publication No. 2012-15176 discloses a light emitting device in which a protruding part or a recess component is provided to the inner peripheral edge and/or the outer peripheral edge on the mounting area side of a metal layer formed around a light emitting element mounting area in order to instantly determine with high accuracy whether or not there is positional deviation of a light reflecting material relative to the mounting area of the light emitting element. The above-mentioned publication also discloses a method for inspecting this type of light emitting device.

SUMMARY

However, the following problems have been encountered with the conventional method discussed above.

With the method for inspecting a light emitting device disclosed in the above-mentioned publication, a protruding part or the like is provided on the mounting area side of a metal layer formed around the light emitting element mounting area in order to determine in the case where there is positional deviation of the light reflecting material with respect to the mounting area of the light emitting element.

However, no consideration whatsoever is given to the detection of the relative positional deviation of the resin molded bodies that are molded so as to sandwich the lead frame using dies.

It is an object of the present invention to provide a semiconductor device with which relative positional deviation of resin molded bodies disposed so as to sandwich a lead frame can be easily detected, as well as to provide a method for manufacturing the semiconductor device.

A semiconductor device according to one aspect includes a lead, a semiconductor element, a first resin molded body, and a second resin molded body. The lead is a thin metal plate having a first surface and a second surface on an opposite side from the first surface. The semiconductor element is fixed to the lead. The first resin molded body is arranged on the first surface of the lead. An outer shape of the first resin molded body is left and right symmetric with respect to a center axis passing through a center of the first resin molded body in a plan view. The second resin molded body is arranged on the second surface of the lead so that the lead is fixed between the first resin molded body and the second resin molded body. An outer shape of the second resin molded body is left and right asymmetric with respect to a center axis passing through a center of the second resin molded body in the plan view.

With a semiconductor device including a lead for supporting and fixing a semiconductor element, and a first resin molded body and a second resin molded body disposed so as to sandwich the lead from above and below, the first resin molded body is formed such that its outer shape is in left and right symmetry, and the second resin molded body is formed such that its outer shape is in left and right asymmetry, in order to detect positional deviation of the second resin molded body with respect to the first resin molded body.

Here, the "lead for supporting and fixing a semiconductor element" is a thin metal plate obtained by dividing a single lead frame, in which a plurality of semiconductor packages are disposed at specific positions, in the process of manufacturing a semiconductor device. The first resin molded body and the second resin molded body are each molded by an upper die and a lower die disposed above and below the lead. Therefore, in the case where a resin is injected in a state in which relative positional deviation has occurred between the upper die and the lower die in the semiconductor device manufacturing process, there is a risk that the first resin molded body and the second resin molded body will end up being molded while their relative positions have shifted.

This relative positional deviation between the first resin molded body and the second resin molded body may cause problems such as deviation of the bending position of the terminal provided to part of the lead, deviation of the disposition of the semiconductor element, or the like. Therefore, detection and management of relative positional deviation between the first resin molded body and the second resin molded body are important in a semiconductor device manufacturing process.

With this semiconductor device, the first resin molded body and the second resin molded body, which are molded so as to sandwich the lead from above and below, are molded so that one is in left and right symmetry and the other is in left and right asymmetry. Accordingly, in a state in which the first resin molded body and the second resin molded body are accurately molded relative to one another, a portion where part of the first resin molded body is visible and a portion where it cannot be seen, in the case where viewed from the second resin molded body side, can be provided.

Therefore, in the case where the first resin molded body and the second resin molded body are molded with relative displacement due to positional deviation between the upper and lower dies, the portions where part of the first resin molded body can and cannot be seen from the second resin molded body side will change.

That is, in the case where there is relative positional deviation between the first resin molded body and the second resin molded body, changes may occur, such as in the case where the part of the first resin molded body that was visible when viewed from the second resin molded body side is no longer visible, or in the case where the part that could not be seen now becomes visible.

As a result, any relative positional deviation between the first resin molded body and the second resin molded body can be easily detected by detecting whether or not there has been a change in the portions of the first resin molded body that can and cannot be seen as viewed from the second resin molded body side.

The semiconductor device according to the second aspect is the semiconductor device according to the first aspect, wherein the first resin molded body has a gate mark.

Here, the first resin molded body formed such that its outer shape is in left and right symmetry is molded by a die on the gate side where the resin is injected.

Consequently, usually the bending of the lead terminal can be properly detected by easily detecting and managing the positioning accuracy of the first resin molded body disposed on the gate side, which is the starting point side where the lead terminal is bent.

The semiconductor device according to the third aspect is the semiconductor device according to the first or second aspect, wherein the second resin molded body defines a recess in which the semiconductor element is placed.

Here, a recess for mounting a semiconductor element is provided to the second resin molded body.

Consequently, a semiconductor device with high accuracy can be manufactured by easily detecting and managing the relative positional deviation between the first resin molded body and the second resin molded body that make up a semiconductor device having the light emitting portion on the second resin molded body side.

The semiconductor device according to the fourth aspect is the semiconductor device according to the third aspect, wherein the recess opens on a side surface of the semiconductor device.

Here, the recess for placing the semiconductor element is provided to a side surface of the semiconductor device.

Here, the "side surface" of the semiconductor device refers to a surface of the second molded body intersecting a mounting surface of the semiconductor device.

This allows positional deviation of a side-emission semiconductor device having a semiconductor element on a side surface to be easily detected.

The semiconductor device according to the fifth aspect is the semiconductor device according to the third aspect, wherein the recess opens on an upper surface of the semiconductor device.

Here, the recess for placing the semiconductor element is provided to the upper surface of the semiconductor device.

Here, the "upper surface" of the semiconductor device refers to the surface of the second molded resin body on the opposite side from the surface facing the lead (i.e., the surface on the opposite side of the mounting surface of the semiconductor device).

This allows any positional deviation of a top-emission semiconductor device having a semiconductor element on its upper surface to be easily detected.

The semiconductor device according to the sixth aspect is the semiconductor device according to any of the first to fifth aspects, wherein the lead further has a terminal that is configured to be connected to external wiring.

Here, a terminal that is configured to be connected to external wiring is provided as part of the lead.

This makes it possible to easily detect and manage whether or not the first resin molded body and the second resin molded body, which are disposed so as to sandwich the lead from above and below, are accurately positioned, so the dimensions of the terminal can be controlled and bending of the terminal can be carried out properly, for example.

As a result, it is possible to effectively eliminate product thickness variance, uneven light emission, variance in the orientation of the light emitting surface, substrate mounting defects during soldering, and other such problems attributable to variance in the dimensions of the terminal.

The method for manufacturing a semiconductor device according to the seventh aspect is a method for manufacturing the semiconductor device according to any of the first to sixth aspects, said method including the steps of setting a lead frame in a die, injecting a resin into the die, and curing the resin to form the first resin molded body and the second resin molded body.

Here, in the above method for manufacturing a semiconductor device, after the lead frame has been placed in the molding die, resin is injected into the cavity of the molding die to mold the first resin molded body and the second resin molded body so as to sandwich the lead frame, and then the resin is cured.

Here, the molding die includes, for example, an upper die for molding the first resin molded body and a lower die for molding the second resin molded body, with these dies disposed so as to sandwich the lead frame.

This makes it possible to manufacture a semiconductor device with which relative positional deviation between the first resin molded body and the second resin molded body attributable to positional deviation of the molding dies can be easily detected.

The method for manufacturing a semiconductor device according to the eighth aspect is the method for manufacturing a semiconductor device according to the seventh aspect, wherein the first resin molded body and the second resin molded body are molded by injection molding or transfer molding.

Here, the resin portions (the first resin molded body and the second resin molded body) that make up the semiconductor device are molded by injection molding or transfer molding.

Consequently, it is possible to manufacture, by using injection molding or transfer molding, a semiconductor device with which relative positional deviation between the first resin molded body and the second resin molded body can be easily detected.

With the semiconductor device according to the above described aspects, a relative positional deviation of the resin molded bodies disposed so as to sandwich the lead can be easily detected.

DETAILED DESCRIPTION OF THE INVENTION

Embodiment 1

The semiconductor device according to an embodiment of the present invention is will now be described through reference to FIGS. 1A to 5 and FIG. 13.

The semiconductor device 10 according to the present embodiment is a light emitting device, and is a so-called side view (side light emission) type of LED (light emitting diode) having its light emitting surface on a side surface.

Figure 1A:
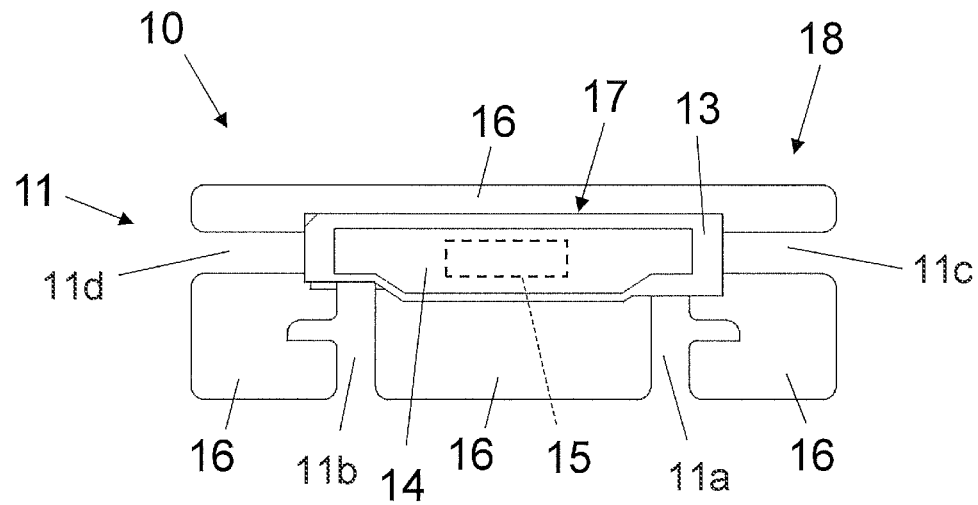
FIG. 1A is a plan view of the configuration of a cavity side of the semiconductor device according to a first embodiment of the present invention.
Figure 1B:
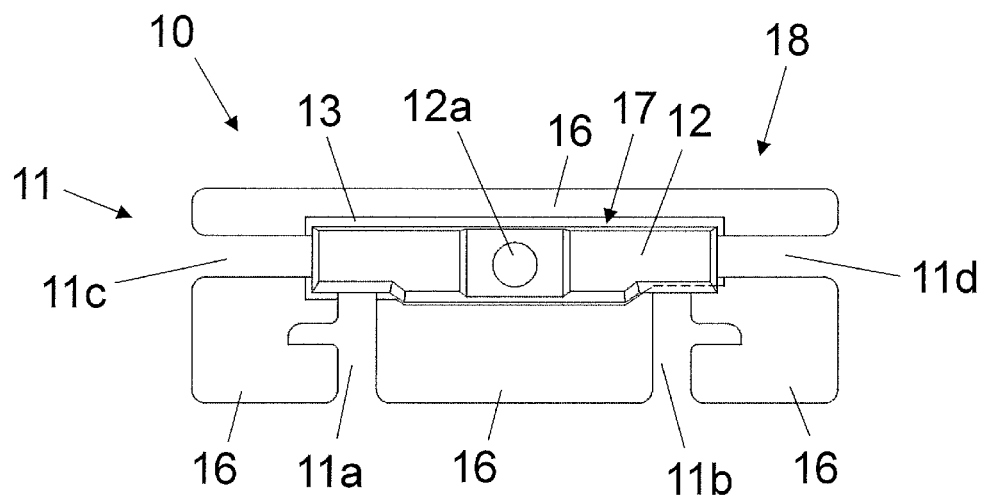
FIG. 1B is a plan view of the configuration on a gate side of the semiconductor device according to the first embodiment of the present invention.

As shown in FIGS. 1A and 1B, the semiconductor device 10 primarily includes a semiconductor element 15 and a package 18 having two leads 11a and 11b that function as a pair of positive and negative electrodes and a resin molded body 17 that integrally holds the two leads 11a and 11b.

The resin molded body 17 has a second resin molded body 13 that is formed on the second surface (upper surface) side of the leads 11a and 11b (the lead frame 11 in the manufacturing process) and includes a portion that becomes a recess 14 that opens on a side surface, and a first resin molded body 12 that is formed on the first surface (lower surface) side (gate side) of the leads 11a and 11b (the lead frame 11 in the manufacturing process).

The first resin molded body 12 and the second resin molded body 13 are integrally formed so as to sandwich the first and second surfaces of the two leads 11a and 11b. The inner surface of the recess 14 of the package 18 is composed of the second resin molded body 13, and the bottom surface of the recess 14 is composed of a part of the two leads 11a and 11b and of the second resin molded body 13 that is in between these leads. In other words, the leads 11a and 11b are exposed from the second resin molded body 13 at the bottom of the recess 14.

The semiconductor element 15 is disposed on the bottom surface of the recess 14 and is electrically connected to the leads 11a and 11b by wires or the like. Parts of the leads 11a and 11b extend to the outside of the resin molded body 17 and function as terminals.

As shown in FIGS. 1A and 1B, with this semiconductor device 10, a package group is prepared in which a plurality of packages 18 having the recess 14 are disposed at predetermined positions, semiconductor elements 15, etc., are attached in the recesses 14, and finally this product is separated into individual packages.

In this package group 18, a plurality of resin molded bodies 17 are arranged in a matrix on a single lead frame 11 including a plurality of holes 16 for forming the leads 11a and 11b and hanger leads 11c and 11d.

Figure 3:
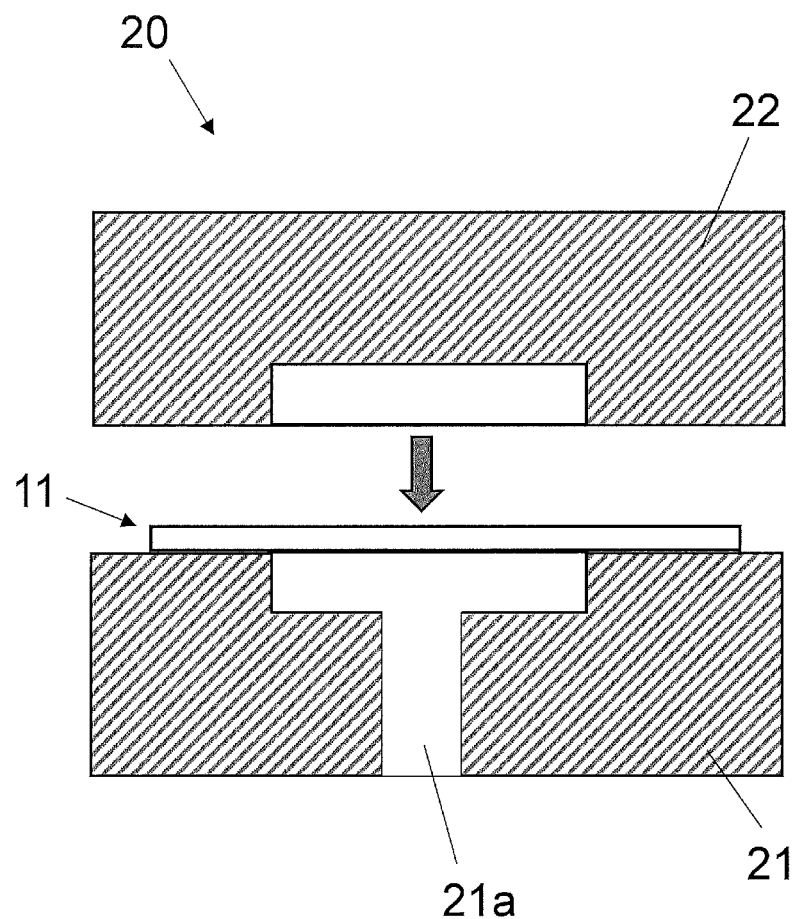
FIG. 3 is a schematic diagram of showing a lead frame and a molding die used for manufacturing the semiconductor device in FIG. 1A.

During molding, as shown in FIG. 3, the first resin molded body 12 is on the lower side and the second resin molded body 13 is on the upper side. During forming, the first resin molded to body 12 may be on the upper side and the second resin molded body 13 may be on the lower side. Furthermore, when the semiconductor device is disposed, the semiconductor device may be manufactured with the first resin molded body 12 on the lower side and the second resin molded body 13 on the upper side. That is, since the semiconductor device is attached so that the opening of the recess 14 faces up, in the description of the process, the opening side of the recess 14, which becomes the light emission surface, shall be described as the upper side.

Figure 13:
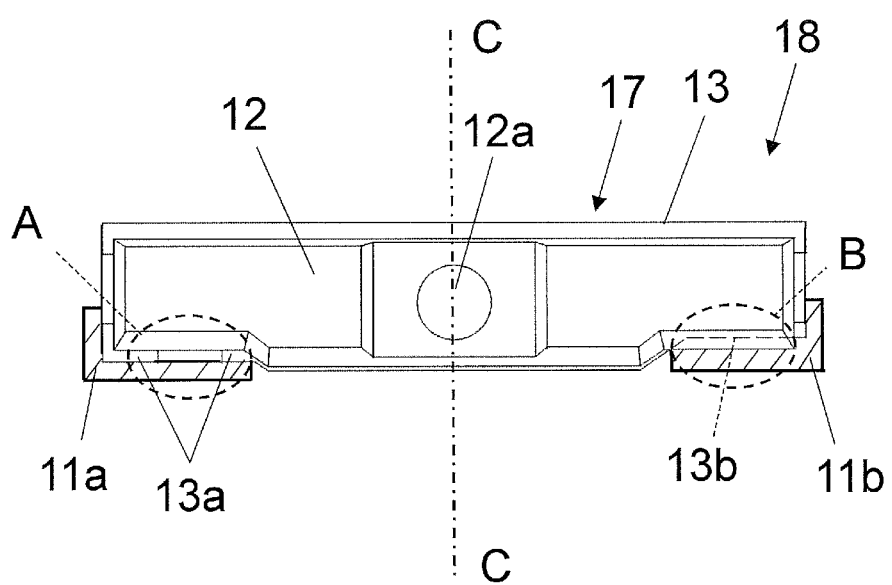
FIG. 13 is a plan view showing the form of a final product of the semiconductor device according to the first embodiment.

The lead frame 11 is a thin metal plate, a plurality of holes 16 are formed at predetermined positions, and the portion left by the holes 16 becomes the leads 11a and 11b that function as terminals and the hanger leads 11c and 11d that function as supports in the final form of the product shown in FIG. 13. Also, the lead frame 11 is sandwiched from above and below (with the second surface side up and the first surface side down) by the first resin molded body 12 and the second resin molded body 13, and has the two leads 11a and 11b that function as electrodes of the semiconductor device 10. Furthermore, the lead frame 11 has a frame portion (not shown) that surrounds the lead frame 11, and the hanger leads 11c and 11d that connect the lead frame 11 and the frame portion, parts of which are embedded in the resin molded body 17 and thereby serve as supports that hold the package 18.

A part of the lead frame 11 includes a portion that is exposed on the bottom surface of the recess 14 and a portion that extends outward from the first resin molded body 12 and the second resin molded body 13. The leads 11a and 11b, which are a part of the lead frame 11 extended to the outside, are bent as shown in FIG. 13 and used as terminals that are connected to external wiring.

The first resin molded body 12 is a resin portion disposed on the first surface (lower surface) side (gate side) of the lead frame 11 in the manufacturing process, and resin is injected into and molded in the cavity of a molding die 20 in which the lead frame 11 has been placed (see FIG. 3). The first resin molded body 12 is molded in a lower die 21 having a gate 21a constituting the molding die 20 (discussed below), and has a gate mark 12a that is connected to the gate 21a.

Figure 2:
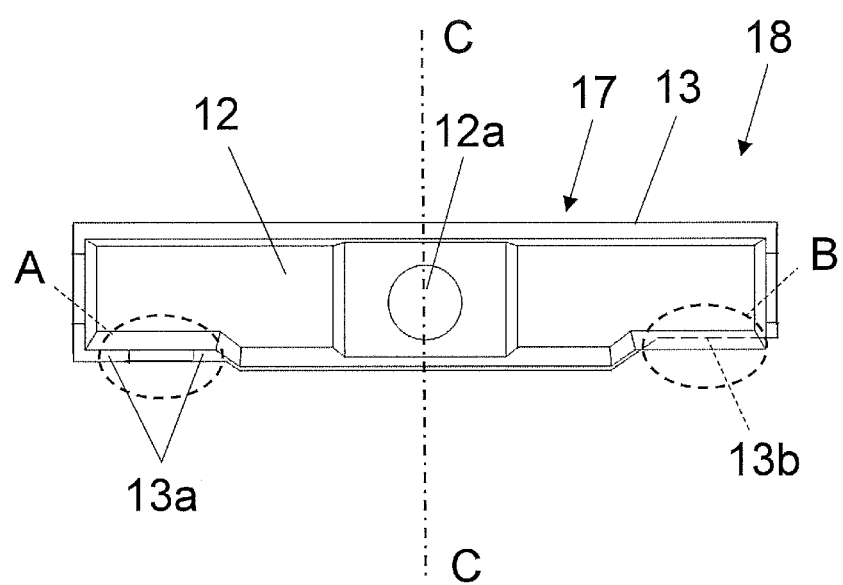
FIG. 2 is a plan view showing the positional relation between a first resin molded body and a second resin molded body as viewed from the gate side in FIG. 1B.

As shown in FIG. 2, the first resin molded body 12 is disposed such that its outer shape is in left and right symmetry with respect to the center axis C-C in plan view.

In this embodiment, the center axis C-C is disposed along the up and down direction in FIG. 2.

The second resin molded body 13 is a resin portion disposed on the second surface (upper surface) side of the lead frame 11 in the manufacturing process, and resin is injected into and molded in the cavity of the molding die 20 in which the lead frame 11 has been placed (see FIG. 3). The second resin molded body 13 is molded in an upper die 22 constituting the molding die 20 (discussed below), and the recess 14 is formed in which the semiconductor element 15 is disposed after molding.

As shown in FIG. 2, the outer shape of the second resin molded body 13 is in left and right asymmetry with respect to the center axis C-C in plan view. More specifically, in the case where the A portion and the B portion of the second resin molded body 13 in FIG. 2 are compared, the sizes of the steps on the side surface are different. As in the front view shown in FIG. 1A, the recess 14 of the package 18, which is wider than it is tall, has an opening width at the central part (the width in the up and down direction) that is greater than the opening width (the width in the up and down direction) on the left and right sides flanking the central part. In a front view of the package 18, the thickness of the package 18 at the lower end of the right side surface is greater than the thickness of the package 18 at the lower end of the left side surface.

Consequently, in the case where viewed from the first resin molded body 12 side, the overlapping portion of the first resin molded body 12 and the second resin molded body 13 looks different in the case where viewed on the right and left. That is, as shown in FIG. 2, a comparison of the A portion and the B portion reveals that in the A portion there is a portion (first determination component 13a) where part of the second resin molded body 13 can be seen, and with the B portion, there is a portion (second determination component 13b) where the second resin molded body 13 cannot be seen.

FIG. 2 shows a state in which the first resin molded body 12 and the second resin molded body 13 are disposed in the proper positions.

Also, the molding die 20 used for molding the first resin molded body 12 and the second resin molded body 13 actually molds a plurality of packages 18 to form a plurality of semiconductor devices 10 with respect to the lead frame 11, to simplify the description, FIG. 3 illustrates the molding of just one package 18.

As shown in FIG. 2, with the package 18 of the semiconductor device 10 in this embodiment, in the case where the first resin molded body 12 and the second resin molded body 13 are disposed at appropriate positions so as to sandwich the leads 11a and 11b, this results in a state in which either the left or right end (the first determination component 13a) of the second resin molded body 13 is visible, and the other one (the second determination component 13b) is not visible, in the case where viewed from the first resin molded body 12 side.

That is, the second resin molded body 13 has the first determination component 13a and the second determination component 13b at the left and right ends in order to detect whether there is any relative positional deviation between the first resin molded body 12 and the second resin molded body 13.

A method for detecting relative positional deviation between the first resin molded body 12 and the second resin molded body 13 will be described in detail below.

The semiconductor element 15 is an LED (light emitting diode), and is fixed to the bottom of the recess 14 formed in the package 18. The semiconductor element 15 emits light in the case where a voltage is applied to terminals formed by bending part of the leads 11a and 11b extending to the outside from the resin molded body 17.

Checking Relative Positional Deviation Between First Resin Molded Body 12 and Second Resin Molded Body 13

As described above, with the package 18 of the semiconductor device 10 in this embodiment, the outer shape of the first resin molded body 12 is in left and right symmetry around the center axis C-C, and the outer shape of the second resin molded body 13 is in left and right asymmetry around the center axis C-C, so that relative positional deviation between the first resin molded body 12 and the second resin molded body 13, which have been molded so as to sandwich the leads 11a and 11b, can be easily checked.

Figure 4A:
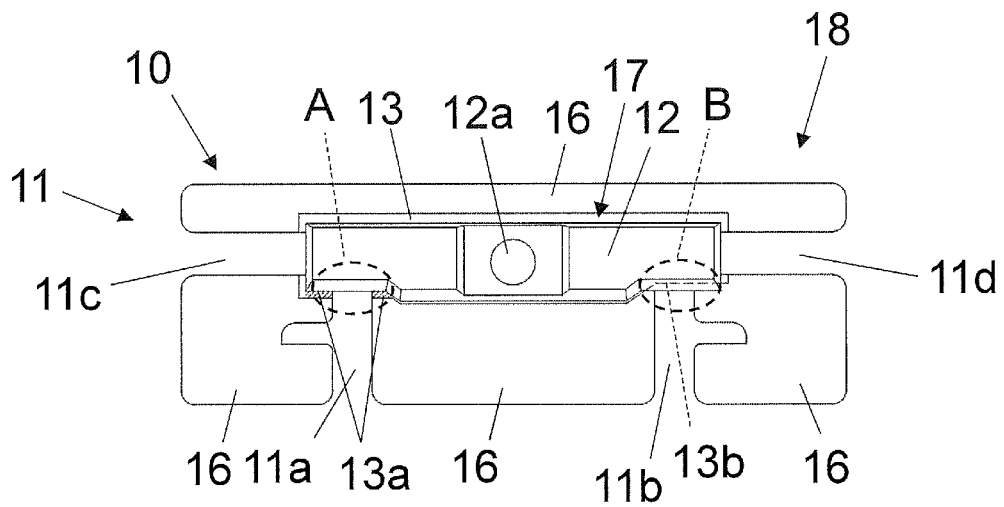
FIG. 4A is a plan view showing a state in which the first resin molded body and the second resin molded body in FIG. 2 are in their proper positions.

Therefore, in the case where the first resin molded body 12 and the second resin molded to body 13 are molded at the appropriate positions, as shown in FIG. 4A, the first determination component 13a (the hatched portion in the drawing) of the second resin molded body 13 can be seen at the A portion, and the second determination component 13b is hidden by the first resin molded body 12 and cannot be seen at the B portion, as viewed from the first resin molded body 12 side.

Here, the A portion and the B portion are boundary portions between the first resin molded body 12 and the second resin molded body 13 and the leads 11a and 11b, and are the starting points of the bends in the leads 11a and 11b that are worked into terminals. Therefore, it is particularly important to make the bends by accurately managing the size (length) of the leads 11a and 11b functioning as the terminals in the A and B portions.

Figure 4B:
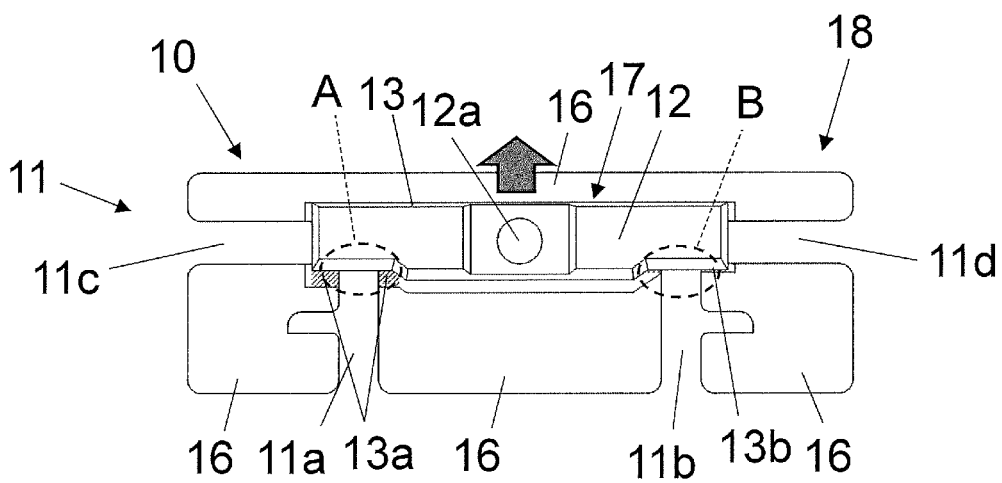
FIG. 4B is a plan view showing a state in which the first resin molded body on the gate side has shifted upward from the state of in FIG. 4A.

On the other hand, in the case where the second resin molded body 13 is molded so as to be displaced to the lower side in the drawing with respect to the first resin molded body 12, as shown in FIG. 4B, this results in a state in which the first determination component 13a (the hatched portion in the drawing) of the second resin molded body 13 becomes prominently visible at the A portion, and the second determination component 13b (the hatched portion in the drawing) is also visible at the B portion, as viewed from the first resin molded body 12 side.

Therefore, in the proper positions, the first determination component 13a is visible at the A portion and the second determination component 13b is not visible in the B portion, but in the case where a state is detected in which the second determination component 13b is visible at the B portion, this makes it easy to determine that there is relative positional deviation between the first resin molded body 12 and the second resin molded body 13.

Figure 4C:
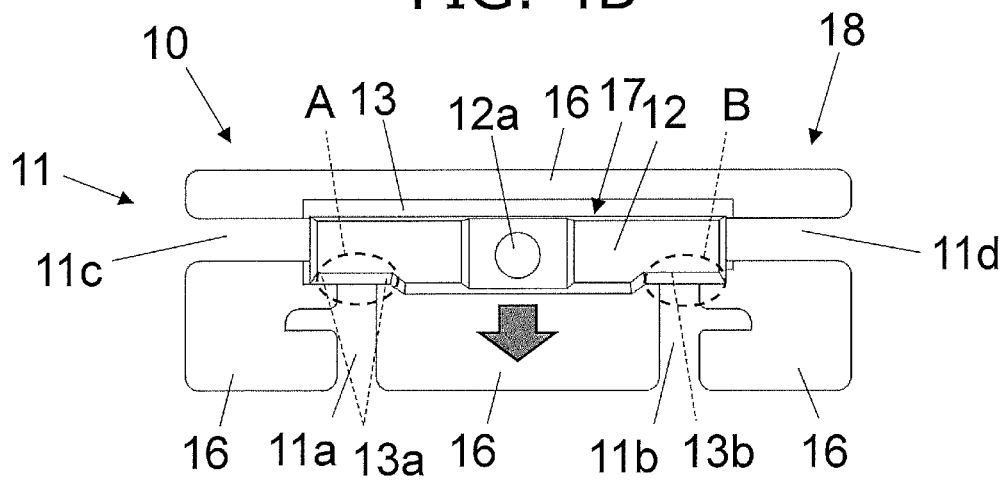
FIG. 4C is a plan view showing a state in which the first resin molded body on the gate side has shifted downward from the state in FIG. 4A.

Furthermore, in the case where the second resin molded body 13 is molded so as to be displaced to the upper side in the drawing with respect to the first resin molded body 12, as shown in FIG. 4C, the first determination component 13a of the second resin molded body 13 cannot be seen at the A portion, and the second determination component 13b also cannot be seen at the B portion, as viewed from the first resin molded body 12 side.

Accordingly, in the proper positions, the first determination component 13a can be seen at the A portion and the second determination component 13b cannot be seen at the B portion, but in the case where a state is detected in which neither the first determination component 13a at the B portion nor the second determination component 13b at the B portion is visible, this makes it easy to determine that there is relative positional deviation between the first resin molded body 12 and the second resin molded body 13.

With the package 18 of the semiconductor device 10 in this embodiment, as described above, in the case where the first resin molded body 12 disposed on the gate side is in the proper position, the A portion (the first determination component 13a) of the second resin molded body 13 is not hidden by the first resin molded body 12 and can be seen in the case where the second resin molded body 13 disposed on the cavity side is viewed from the gate side near the leads 11a and 11b functioning as terminals. On the other hand, the B portion (the second determination component 13b) of the second resin molded body 13 is hidden by the first resin molded body 12 and cannot be seen in this state.

That is, in this embodiment, in the case where the first resin molded body 12 and the second resin molded body 13 are molded so that they are in their proper positions relative to one another, the first determination component 13a of the A portion can be seen, but the second determination component 13b of the B portion cannot, and this state is used as a reference.

Consequently, a change from this reference state, such as a state in which the first determination component 13a of the A portion cannot be seen, or in which the second determination component 13b of the B portion can be seen, can be detected through image processing or the like, which makes it easy to determine whether there is any relative positional deviation between the first resin molded body 12 and the second resin molded body 13.

More specifically, it can be determined that the first resin molded body 12 has been displaced upward in the drawing (see the arrow) by detecting the state shown in FIG. 4B in which the first determination component 13a of the A portion is visible and the second determination component 13b of the B portion is also visible, from the reference state shown in FIG. 4A (in which the first determination component 13a of the A portion is visible and the second determination component 13b of the B portion is not visible).

It can be determined that the first resin molded body 12 has been displaced downward in the drawing (see the arrow) by detecting the state shown in FIG. 4C in which the first determination component 13a of the A portion cannot be seen and the second determination component 13b of the B portion also cannot be seen, from the reference state shown in FIG. 4A (in which the first determination component 13a of the A portion is visible and the second determination component 13b of the B portion is not visible).

As a result, any relative positional deviation between the first resin molded body 12 and the second resin molded body 13 attributable to relative positional deviation (mismatching) between the upper die 22 and the lower die 21 constituting the molding die 20 can be easily detected.

This allows the occurrence of defective products due to relative positional deviation between the first resin molded body 12 and the second resin molded body 13 to be strictly managed.

Also, with the semiconductor device 10 in this embodiment, the upper die 22 and the lower die 21 constituting the molding die 20 are such that the shape of the upper die 22 disposed on the opposite side from the lower die 21 on the gate side, which serves as the bending start point of the leads 11a and 11b functioning as terminals, is in left and right asymmetry (shape offset).

Consequently, as described above, it is possible to provide the semiconductor device 10 with which relative positional deviation between the first resin molded body 12 and the second resin molded body 13 can be easily detected and managed.

The left and right asymmetry of the second resin molded body 13 provided for positional deviation detection and determination may be used as a mark (cathode mark) for polarity determination.

Furthermore, as described above, the semiconductor device 10 in this embodiment is a so-called side view (side-surface light emission) type of LED in which the semiconductor element 15 attached to a side surface emits light.

Therefore, the relative positional deviation between the first resin molded body 12 and the second resin molded body 13 in the up and down direction in FIG. 4A leads to variance in the length of the terminals formed by bending the leads 11a and 11b, and may be a factor in variance in the orientation of the light emitting surface, variance in the thickness of the product, and other such problems. Thus, management of positional deviation in the up and down direction in the drawing is particularly important in this embodiment.

Method for Manufacturing Semiconductor Device 10

Figure 5:
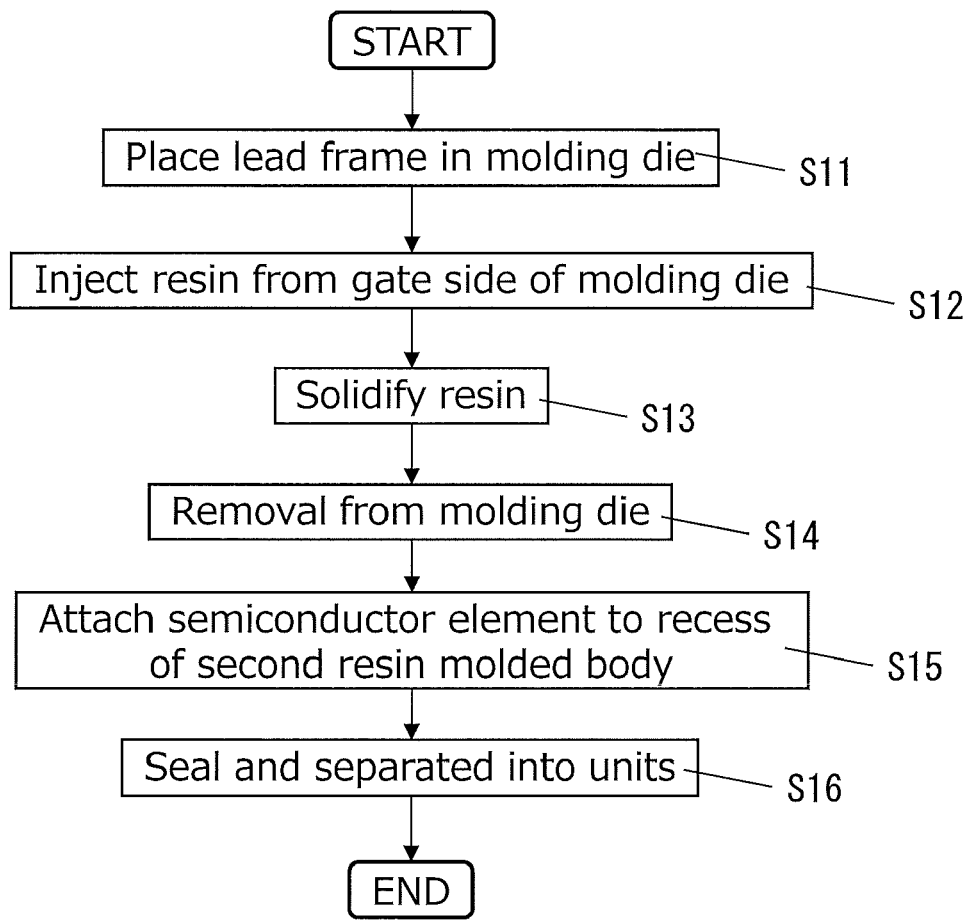
FIG. 5 is a flowchart showing a method for manufacturing the semiconductor device in FIG. 1A.

With the method for manufacturing the semiconductor device 10 in this embodiment, the above-mentioned semiconductor device 10 is manufactured according to the flowchart shown in FIG. 5.

That is, as described above, with the semiconductor device 10 in this embodiment, in order to easily detect the relative positional deviation between the first resin molded body 12 and the second resin molded body 13 formed so as to sandwich the leads 11a and 11b (the lead frame 11 in the manufacturing process) from above and below using the molding die 20 shown in FIG. 3, the outer shape of the first resin molded body 12 is formed in left and right symmetry around the center axis C-C shown in FIG. 2 in plan view, and the outer shape of the second resin molded body 13 is formed in left and right asymmetry around the center axis C-C shown in FIG. 2.

More specifically, in step S11, the lead frame 11 is placed at a predetermined position in the molding die 20 (lower die 21) (see FIG. 3).

Next, in step S12, the lower die 21 and the upper die 22 of the molding die 20 are closed, after which resin is injected into the molding die 20 from the gate 21a of the lower die 21.

Next, in step S13, once the injection of the resin from the gate 21a of the lower die 21 is complete, the die 20 is cooled to solidify the injected resin, for example.

Next, in step S14, the first resin molded body 12 and the second resin molded body 13 molded in a state of being integrated with the lead frame 11 are taken out of the molding die 20.

Next, in step S15, the semiconductor element 15 is attached in the recess 14 formed on the upper surface of the second resin molded body 13.

Next, in step S16, after sealing, the individual semiconductor devices 10 are separated from the lead frame 11.

With the semiconductor device 10 in this embodiment, the result of the above process is that the outer shape of the first resin molded body 12 is formed in left and right symmetry around the center axis C-C in plan view, and the outer shape of the second resin molded body 13 is formed in left and right asymmetry around the center axis C-C.

Consequently, a semiconductor device 10 can be manufactured with which the relative positional deviation between the first resin molded body 12 and the second resin molded body 13 can easily detected.

Embodiment 2

A semiconductor device 30 according to another embodiment of the present invention will now be described with reference to FIGS. 6A to 7B.

The semiconductor device 30 in this embodiment differs from Embodiment 1, which described a side view (side emission) type of LED in which the light emission surface is arranged on the side surface intersecting the mounting surface of the semiconductor device 10, in that it is a so-called top view (top emission) type of LED (light emitting diode) in which a semiconductor element 35 (light emitting element) is disposed on the upper surface so that the light emission surface is arranged on the opposite side of the mounting surface.

Figure 6A:
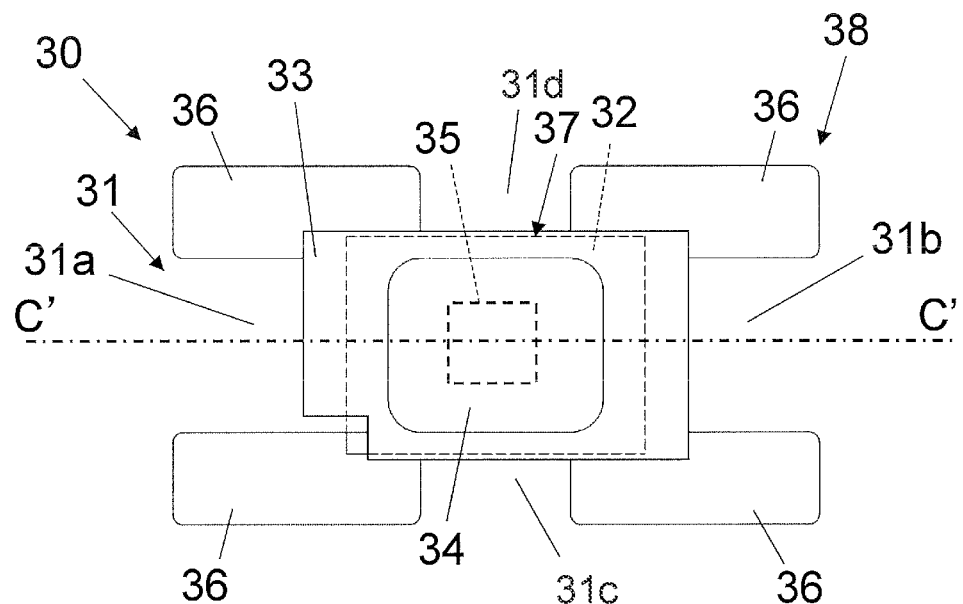
FIG. 6A is a plan view of the configuration of the cavity side of the semiconductor device according to a second embodiment of the present invention.
Figure 6B:
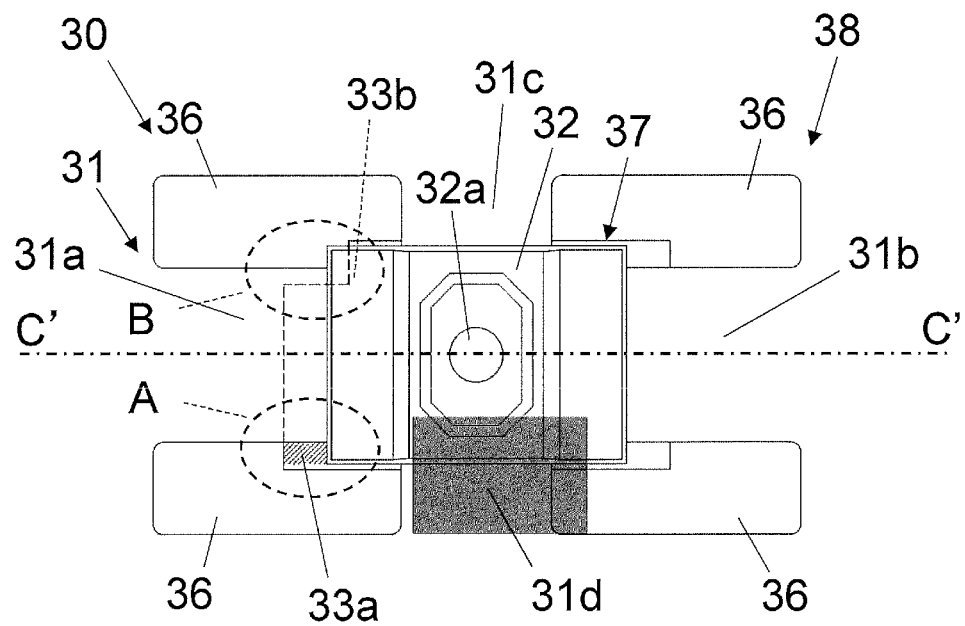
FIG. 6B is a plan view of the configuration on the gate side of the semiconductor device according to the second embodiment.

The semiconductor device 30 according to this embodiment is a light emitting device, and is a so-called top view (top emission) type of LED (light emitting diode) having the light emitting surface on its upper surface. As shown in FIGS. 6A and 6B, the semiconductor device 30 mainly includes a semiconductor element 35 and a package 38 having two leads 31a and 31b functioning as a pair of positive and negative electrodes and a resin molded body 37 that integrally holds the leads 31a and 31b.

The leads 31a and 31b and the semiconductor element 35 have substantially the same functions as those of the leads 11a and 11b and the semiconductor element 15 in Embodiment 1 above, and therefore will not be described again in detail.

The resin molded body 37 has a second resin molded body 33 that is formed on the second surface (upper surface) side of the leads 31a and 31b (a lead frame 31 in the manufacturing process) and has a portion that becomes a recess 34 that opens on a top surface, and a first resin molded body 32 that is formed on the first surface (lower surface) side (gate side) of the leads 31a and 31b (the lead frame 31 in the manufacturing process).

The first resin molded body 32 and the second resin molded body 33 are integrally formed so as to sandwich the first surface and the second surface of the two leads 31a and 31b. The inner surface of the recess 34 of the package 38 is composed of the second resin molded body 33, and the bottom of the recess 34 is composed of a part of the two leads 31a and 31b and the second resin molded body 33 in between these leads. In other words, the leads 31a and 31b are exposed from the second resin molded body 33 at the bottom of the recess 34.

The semiconductor element 35 is disposed on the bottom of the recess 34, and is to electrically connected to the leads 31a and 31b via wires or the like. Parts of the leads 31a and 31b extend to the outside of the resin molded body 37 and function as terminals.

As shown in FIGS. 6A and 6B, with this semiconductor device 30, a package group is prepared in which a plurality of packages 38 having the recess 14 are disposed at predetermined positions, semiconductor elements 35, etc., are attached in the recesses 34, and finally this product is separated into individual packages.

In this package group 38, a plurality of resin molded bodies 37 are arranged in a matrix on a single lead frame 31 including a plurality of holes 36 for forming the leads 31a and 31b and hanger leads 31c and 31 d.

The first resin molded body 32 is a resin portion disposed on the gate side with respect to the leads 31a and 31b (the lead frame 31 in the manufacturing process), and is molded by injecting resin into the molding die 20 in which the lead frame 31 has been placed (see FIG. 3). The first resin molded body 32 has a gate mark 32a connected to the gate 21a of the molding die 20.

As shown in FIGS. 6A and 6B, the outer shape of the first resin molded body 32 is substantially square in plan view, and the first resin molded body 32 is disposed in left and right symmetry with respect to the center axis C'-C'.

In FIGS. 6A and 6B, the center axis C'-C' is disposed along the left and right direction, so in the drawings the components are depicted in top and bottom symmetry (linear symmetry) around the center axis C'-C'. In the drawings, linear symmetry (top and bottom symmetry) centering on the center axis disposed along the left and right direction is referred to as "left and right symmetry," and linear asymmetry (top and bottom asymmetry) is referred to as "left and right asymmetry."

The second resin molded body 33 is a resin portion disposed on the cavity side with respect to the leads 31a and 31b (the lead frame 31 in the manufacturing process), and is molded by injecting resin into the molding die 20 in which the lead frame 31 has been placed (see FIG. 3). The recess 34 in which the semiconductor element 35 is placed is formed in the second resin molded body 33 after molding.

As shown in FIGS. 6A and 6B, the second resin molded body 33 is disposed such that its outer shape is in left and right asymmetry with respect to the center axis C'-C' in plan view. More specifically, the second resin molded body 33 is such that in the case where the A portion and the B portion in FIG. 6B are compared, the B portion is different in that it is cut away.

Consequently, in the case where viewed from the first resin molded body 32 side, the overlapping portion of the first resin molded body 32 and the second resin molded body 33 looks different on the right and left. That is, as shown in FIG. 6B, a comparison of the A portion and the B portion reveals that in the A portion there is a portion (first determination component 33a) where part of the second resin molded body 33 can be seen, and in the B portion, there is a portion (second determination component 33b) where the second resin molded body 33 cannot be seen.

FIG. 6B shows a state in which the first resin molded body 32 and the second resin molded body 33 are disposed in the proper positions.

With the semiconductor device 30 in this embodiment, as shown in FIG. 6B, in the case where the first resin molded body 32 and the second resin molded body 33 are disposed in the proper positions so as to sandwich the leads 31a and 31b (the lead frame 31 in the manufacturing to process), this results in a state in which either the left or right end of the second resin molded body 33 centered on the center axis C'-C' (the first determination component 33a) is visible, and the other one (the second determination component 33b) is not visible, in the case where viewed from the first resin molded body 32 side.

That is, the second resin molded body 33 has the first determination component 33a and the second determination component 33b at the left and right ends around the center axis C'-C' in order to detect whether there is any relative positional deviation between the first resin molded body 32 and the second resin molded body 33.

The recess 34 is a recess portion formed on the upper surface of the second resin molded body 33, that is, a surface of the second resin molded body 33 that is substantially parallel to the leads 31a and 31b, and the semiconductor element 35 is placed in this recess 34.

Checking Relative Positional Deviation Between First Resin Molded Body 32 and Second Resin Molded Body 33

As described above, with the semiconductor device 30 in this embodiment, the outer shape of the first resin molded body 32 is in left and right symmetry around the center axis C'-C', and the outer shape of the second resin molded body 33 is in left and right asymmetry around the center axis C'-C', so that any relative positional deviation between the first resin molded body 32 and the second resin molded body 33 disposed so as to sandwich the leads 31a and 31b (the lead frame 31 in the manufacturing process) can be easily checked.

Therefore, in the case where the first resin molded body 32 and the second resin molded to body 33 are molded at the proper positions, as shown in FIG. 6B, at the A portion the first determination component 33a (the hatched part in the drawing) of the second resin molded body 33 can be seen, but at the B portion the second determination component 33b is hidden by the first resin molded body 32 and cannot be seen, as viewed from the first resin molded body 32 side.

Here, the A and B portions are boundary portions between the first resin molded body 32 and the second resin molded body 33 and the lead 31a functioning as a terminal, and serve as the starting points of bending of the lead 31a. Therefore, it is particularly important to accurately manage and bend the size (length) of the terminal formed by bending the lead 31a in the A and B portions.

Figure 7A:
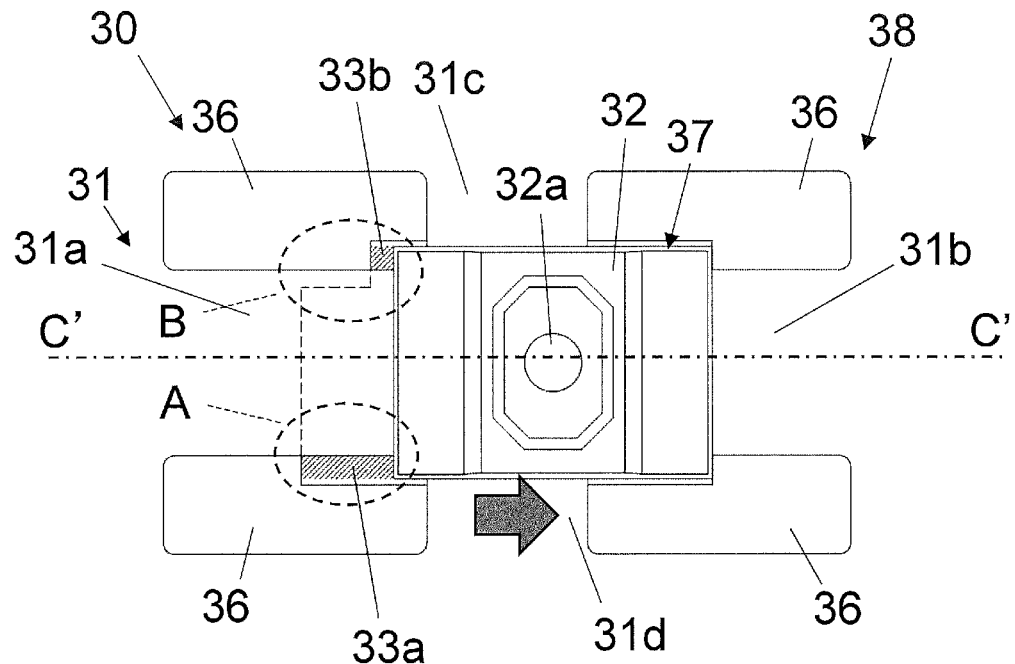
FIG. 7A is a plan view showing a state in which the first resin molded body on the gate side has shifted to the right from the state in FIG. 6B.

On the other hand, in the case where the first resin molded body 32 is molded so as to be displaced to the right side in the drawing (see the arrow) with respect to the second resin molded body 33, as shown in FIG. 7A, in the case where viewed from the first resin molded body 32 side, the first determination component 33a (the hatched portion in the drawing) of the second resin molded body 33 looks large in the A portion, and the second determination component 33b (the hatched portion in the drawing) is also visible in the B portion.

Therefore, in the proper positions, the first determination component 33a is visible in the A portion and the second determination component 33b is not visible in the B portion, but in the case where a state is detected in which the second determination component 33b is visible in the B portion, this makes it easy to determine that there is relative positional deviation between the first resin molded body 32 and the second resin molded body 33.

Figure 7B:
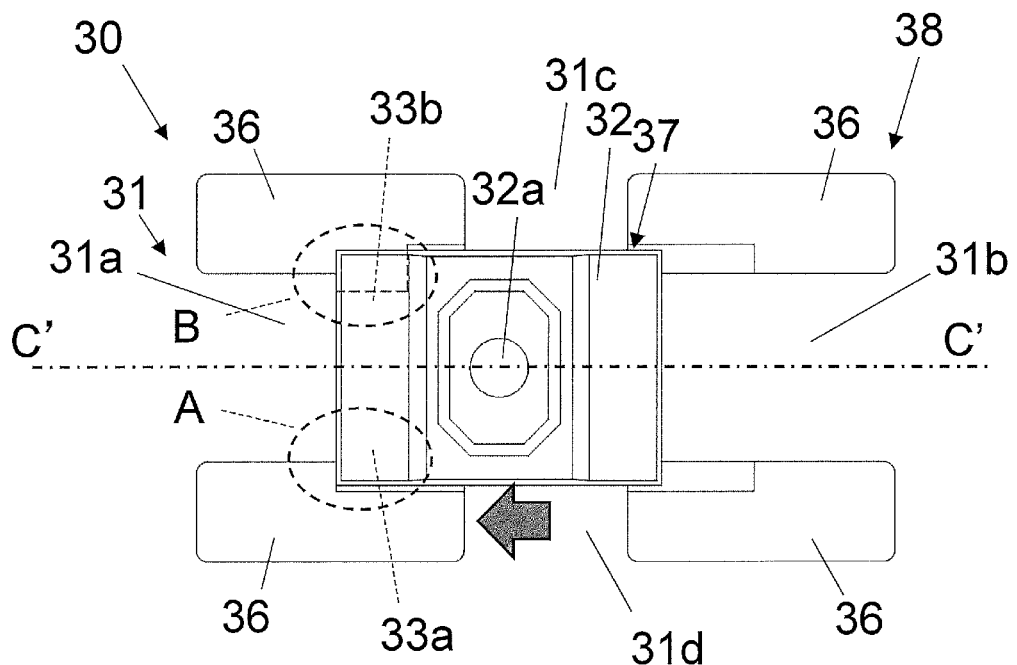
FIG. 7B is a plan view showing a state in which the first resin molded body on the gate side has shifted to the left from the state in FIG. 6B.

Furthermore, in the case where the first resin molded body 32 is molded so as to be displaced to the left side in the drawing (see the arrow) with respect to the second resin molded body 33, as shown in FIG. 7B, the first determination component 33a of the second resin molded body 33 cannot be seen at the A portion, and the second determination component 33b also cannot be seen at the B portion, as viewed from the first resin molded body 32 side.

Accordingly, in the proper positions, the first determination component 33a can be seen at the A portion and the second determination component 33b cannot be seen at the B portion, but in the case where a state is detected in which neither the first determination component 33a at the A portion nor the second determination component 33b at the B portion is visible, this makes it easy to determine that there is relative positional deviation between the first resin molded body 32 and the second resin molded body 33.

With the semiconductor device 30 in this embodiment, as described above, in the case where the first resin molded body 32 disposed on the gate side is in the proper position, the A portion (the first determination component 33a) of the second resin molded body 33 is not hidden by the first resin molded body 32 and can be seen in the case where the second resin molded body 33 disposed on the cavity side is viewed from the gate side near the lead 31a functioning as a terminal. On the other hand, the B portion (the second determination component 33b) of the second resin molded body 33 is hidden by the first resin molded body 32 and cannot be seen.

That is, in this embodiment, in the case where the first resin molded body 32 and the second resin molded body 33 are molded at their proper positions relative to one another, a state in which the first determination component 33a of the A portion can be seen and the second determination component 33b of the B portion cannot be seen is used as a reference for the proper position.

Consequently, whether or not there is any relative positional deviation between the first resin molded body 32 and the second resin molded body 33 can be easily determined by detecting a change from this reference state, such as a state in which the first determination component 33a of the A portion cannot be seen, or the second determination component 33b of the B portion can be seen.

Also, with the semiconductor device 30 in this embodiment, the upper die 22 and the lower die 21 constituting the molding die 20 are such that the shape of the upper die 22 disposed on the opposite side from the lower die 21 on the gate side, which serves as the bending start point of the leads 31a and 31b functioning as a terminal, is in left and right asymmetry (shape offset).

Consequently, as described above, it is possible to provide the semiconductor device 30 with which relative positional deviation between the first resin molded body 32 and the second resin molded body 33 can be easily detected and managed.

As in Embodiment 1 above, the left and right asymmetry of the second resin molded body 33 provided for positional deviation detection and determination may be used as a mark (cathode mark) for polarity determination.

Furthermore, as described above, the semiconductor device 30 in this embodiment is a so-called top view (top emission) type of LED in which the semiconductor element 35 attached to the top surface emits light.

Therefore, the relative positional deviation between the first resin molded body 32 and the second resin molded body 33 in the left and right direction in FIG. 7A, etc. leads to variance in the length of the terminals formed by bending the lead 31a, and may be a factor in causing a difference in height between the left and right terminals, variance in the orientation of the light emitting surface during substrate mounting, and other such problems. Thus, management of positional deviation in the left and right direction in the drawing is particularly important in this embodiment.

Embodiment 3

A semiconductor device 40 according to yet another embodiment of the present invention will now be described with reference to FIGS. 8A to 9B.

The semiconductor device 40 in this embodiment is the same as in Embodiment 2 in that it is a so-called top view (top emission) type of LED (light emitting diode) in which a semiconductor element 45 (light emitting element) is disposed on the upper surface. On the other hand, this embodiment differs from Embodiment 2 in that notches of different sizes are provided at two locations (above and below) of a second resin molded body 43 that is formed in left and right asymmetry around the center axis C'-C'.

Figure 8A:
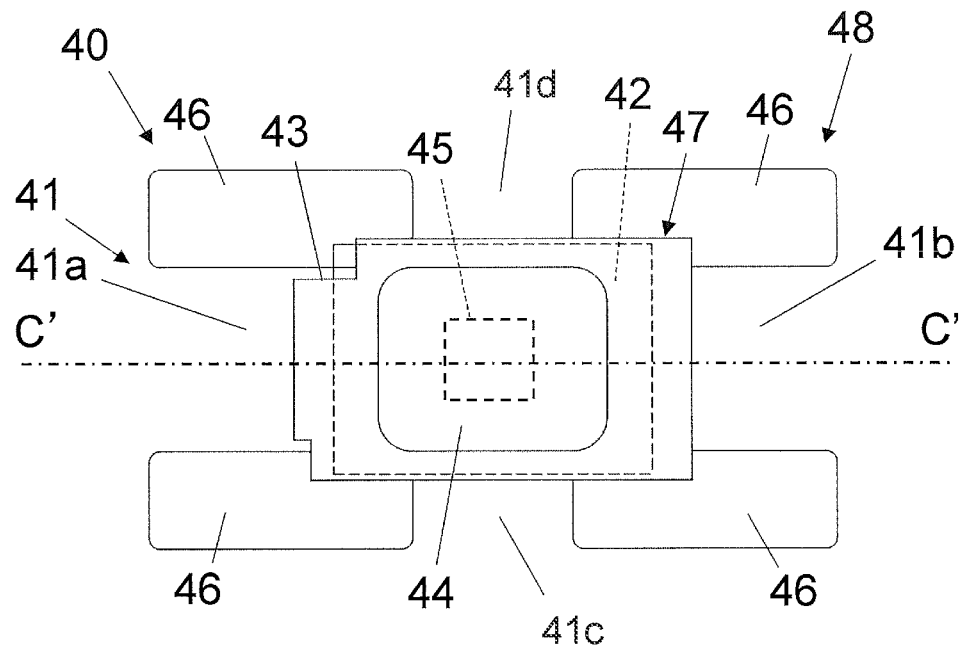
FIG. 8A is a plan view of the configuration of the cavity side of the semiconductor device according to a third embodiment of the present invention.
Figure 8B:
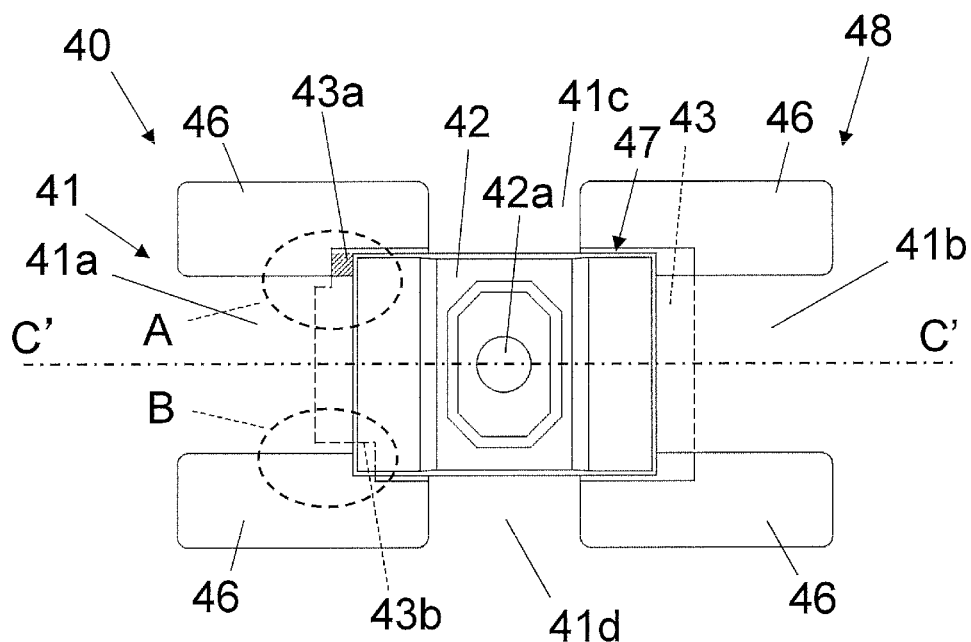
FIG. 8B is a plan view of the configuration on the gate side of the semiconductor device according to the third embodiment.

The semiconductor device 40 according to this embodiment is a light emitting device, and is a so-called top view (top emission) type of LED (light emitting diode) having the light emitting surface on its upper surface. As shown in FIGS. 8A and 8B, the semiconductor device 40 mainly includes a semiconductor element 45 and a package 48 having two leads 41a and 41b functioning as a pair of positive and negative electrodes and a resin molded body 47 that integrally holds the leads 41a and 41b.

The leads 41a and 41b and the semiconductor element 45 have substantially the same functions as those of the leads 11a and 11b and the semiconductor element 15 in Embodiment 1 above, and will therefore not be described again in detail.

The resin molded body 47 has a second resin molded body 43 that is formed on the second surface (upper surface) side of the leads 41a and 41b (the lead frame 41 in the manufacturing process) and is provided with a portion that will become a recess 44 that opens on the upper surface, and a first resin molded body 42 that is formed on the first surface (lower surface) side (gate side) of the leads 41a and 41b (the lead frame 41 in the manufacturing process).

The first resin molded body 42 and the second resin molded body 43 are integrally formed so as to sandwich the first surface and the second surface of the two leads 41a and 41b. The inner side surface of the recess 44 of the package 48 is composed of the second resin molded body 43, and the bottom surface of the recess 44 is composed of a part of the two leads 41a and 41b and the second resin molded body 43 in between them. In other words, the leads 41a and 41b are exposed from the second resin molded body 43 at the bottom of the recess 44.

The semiconductor element 45 is disposed on the bottom of the recess 44, and is electrically connected to the leads 41a and 41b via wires or the like. Parts of the leads 41a and 41b respectively extend to the outside of the resin molded body 47 and function as terminals.

As shown in FIGS. 8A and 8B, with this semiconductor device 40, a package group in which a plurality of packages 48 having the recess 44 are disposed at specific locations is prepared, the semiconductor elements 45 and the like are attached in the recesses 44, and finally the packages are separated from each other.

In the group of packages 48, a plurality of resin molded bodies 47 are disposed in a matrix on one lead frame 41 including a plurality of holes 46 for forming the leads 41a and 41b and the hanger leads 41c and 41d.

The first resin molded body 42 is a resin portion disposed on the gate side with respect to the leads 41a and 41b (the lead frame 41 in the manufacturing process), and is molded by injecting resin into the molding die 20 in which the lead frame 41 has been placed (see FIG. 3). The first resin molded body 42 has a gate mark 42a connected to the gate 21a of the molding die 20.

As shown in FIGS. 8A and 8B, the outer shape of the first resin molded body 42 is substantially square in plan view, and is disposed in left and right symmetry with respect to the center axis C'-C'.

In FIGS. 8A and 8B, the center axis C'-C' is disposed along the left and right direction.

The second resin molded body 43 is a resin portion disposed on the cavity side with respect to the leads 41a and 41b (the lead frame 41 in the manufacturing process), and is molded by injecting resin into the molding die 20 in which the lead frame 41 has been placed (see FIG. 3). Also, a recess 44 in which the semiconductor element 45 is placed after molding is formed in the second resin molded body 43.

As shown in FIGS. 8A and 8B, the second resin molded body 43 is disposed such that its outer shape is in left and right asymmetry with respect to the center axis C'-C' in plan view. More specifically, the A portion and the B portion of the second resin molded body 43 in FIG. 8B differ in the size of the notched portions.

As a result, in the case where viewed from the first resin molded body 42 side, the overlapping portions of the first resin molded body 42 and the second resin molded body 43 look different on the left and right. That is, in the case where the A portion and the B portion are compared, as shown in FIG. 8B, in the A portion there is a part where the second resin molded body 43 can be seen (the first determination component 43a), and in the B portion there is a portion where the second resin molded body 43 cannot be seen (the second determination component 43b).

FIG. 8B shows a state in which the first resin molded body 42 and the second resin molded body 43 are disposed in the proper positions.

With the semiconductor device 40 in this embodiment, as shown in FIG. 8B, in the case where the first resin molded body 42 and the second resin molded body 43 are disposed in the proper positions so that they sandwich the leads 41a and 41b (the lead frame 41 in the manufacturing process), then either the left or the right end of the second resin molded body 43 (the first determination component 43a) centered on the center axis C'-C' can be seen, and the other end (the second determination component 43b) cannot be seen.

That is, in order to detect whether there is any relative positional deviation between the first resin molded body 42 and the second resin molded body 43, the second resin molded body 43 has left and right the first determination component 43a and the second determination component 43b at its left and right ends centering on the center axis C'-C'.

The recess 44 is a recess portion formed on the upper surface of the second resin molded body 43, that is, a surface substantially parallel to the leads 41a and 41b (the lead frame 41 in the manufacturing process) of the second resin molded body 43, and the semiconductor element 45 is mounted in this recess.

Checking for Relative Positional Deviation Between First Resin Molded Body 42 and Second Resin Molded Body 43

As described above, with the semiconductor device 40 in this embodiment, the first resin molded body 42 is formed in left and right symmetry around the center axis C'-C', and the second resin molded body 43 is formed in left and right asymmetry around the center axis C'-C', so as to make it easy to check for relative positional deviation between the first resin molded body 42 and the second resin molded body 43, which are disposed so as to sandwich the leads 41a and 41b (the lead frame 41 in the manufacturing process).

Therefore, in the case where the first resin molded body 42 and the second resin molded body 43 are molded in their proper positions, as shown in FIG. 8B, viewed from the first resin molded body 42 side, at the A portion the first determination component 43a (the hatched portion in the drawing) of the second resin molded body 43 can be seen, but at the B portion the second determination component 43b is hidden by the first resin molded body 42 and cannot be seen.

Here, the A and B portions are boundary portions between the first resin molded body 42 and the second resin molded body 43 and the lead 41a functioning as a terminal, and serve as starting points for bending of the lead 41a. Therefore, it is particularly important to accurately manage the size (length) of the terminal formed by bending the lead 41a in the A and B portions.

Figure 9A:
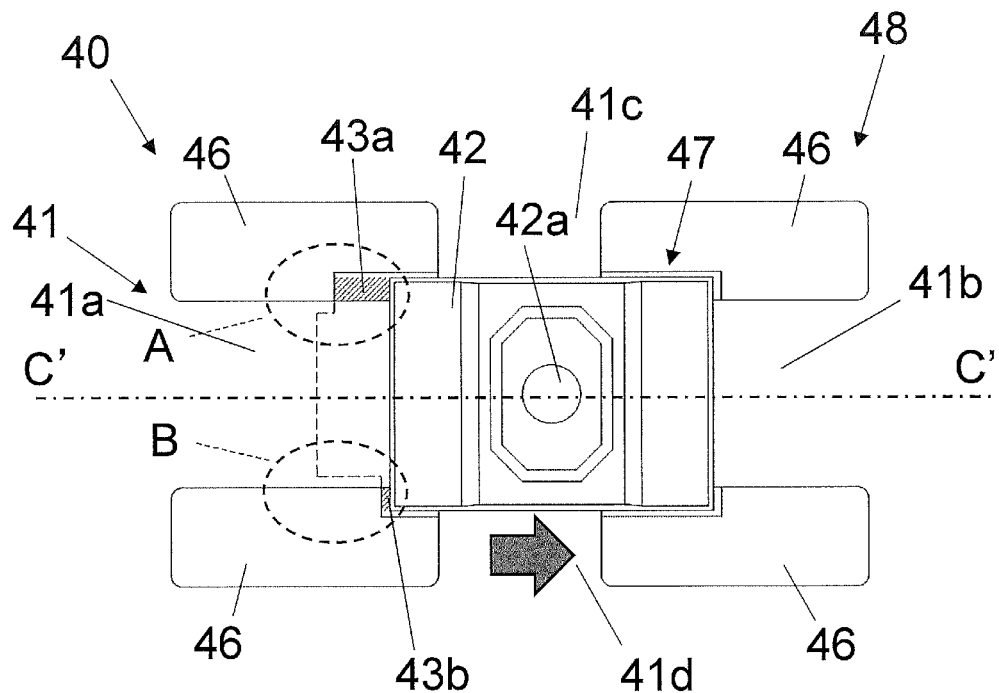
FIG. 9A is a plan view showing a state in which the first resin molded body on the gate side has shifted to the right from the state in FIG. 8B.

On the other hand, in the case where the first resin molded body 42 is molded so as to be displaced to the right side in the drawing (see the arrow) with respect to the second resin molded body 43, as shown in FIG. 9A, viewed from the first resin molded body 42 side, in the A portion the first determination component 43a (the hatched portion in the drawing) of the second resin molded body 43 is plainly visible, and in the B portion the second determination component 43b (the hatched portion in the drawing) is also visible.

Therefore, in the proper positions, the first determination component 43a is visible in the A portion and the second determination component 43b is not visible in the B portion, but in the case where a state is detected in which the second determination component 43b is visible in the B portion, it can be easily determined that there is relative positional deviation between the first resin molded body 42 and the second resin molded body 43.

Figure 9B:
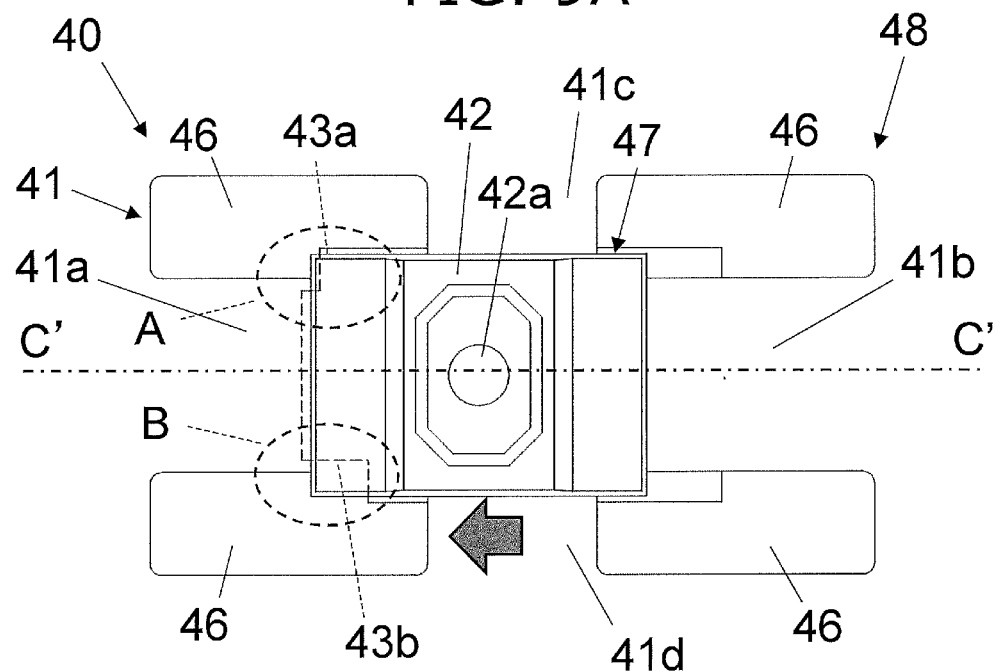
FIG. 9B is a plan view showing a state in which the first resin molded body on the gate side has shifted to the left from the state in FIG. 8B.

Furthermore, in the case where the first resin molded body 42 is molded so as to be displaced to the left side in the drawing (see the arrow) with respect to the second resin molded body 43, as shown in FIG. 9B, viewed from the first resin molded body 42 side, in the A portion the first determination component 43a of the second resin molded body 43 cannot be seen, and in the B portion the second determination component 43b also cannot be seen.

Accordingly, in the proper positions, in the A portion the first determination component 43a is visible and in the B portion the second determination component 43b is not visible, but in the case where a state is detected in which the first determination component 43a in the A portion and the second determination component 43b in the B portion cannot both be seen, it can be easily determined that there is relative positional deviation between the first resin molded body 42 and the second resin molded body 43.

With the semiconductor device 40 in this embodiment, as described above, in the case where the first resin molded body 42 disposed on the gate side is in the proper position, then in the case where the second resin molded body 43 disposed on the cavity side is viewed from the gate side, the A portion (the first determination component 43a) of the second resin molded body 43 is not hidden by the first resin molded body 42 and can be seen. On the other hand, the B portion (the second determination component 43b) of the second resin molded body 43 is hidden by the first resin molded body 42 and cannot be seen.

That is, in this embodiment, in the case where the first resin molded body 42 and the second resin molded body 43 are molded in their proper positions relative to each other, a state in which the first determination component 43a of the A portion can be seen and the second determination component 43b of the B portion cannot be seen is used as a reference for the proper positions.

Consequently, whether or not there is any relative positional deviation between the first resin molded body 42 and the second resin molded body 43 can be easily determined by detecting a change from this reference state, such as a state in which the first determination component 43a of the A portion cannot be seen or in which the second determination component 43b of the B portion can be seen.

Also, with the semiconductor device 40 in this embodiment, in regard to the upper die 22 and the lower die 21 constituting the molding die 20, the shape of the upper die 22 disposed on the opposite side from the lower die 21 on the gate side, which serves as the bending starting point for the leads 41a and 41b functioning as a terminal, is in left and right asymmetry (shape offset).

Consequently, as discussed above, it is possible to provide a semiconductor device 40 with which relative positional deviation between the first resin molded body 42 and the second resin molded body 43 can be easily detected and managed.

As in Embodiment 1 above, the left/right asymmetrical shape of the second resin molded body 43 provided for positional deviation detection and determination may be used as a mark for polarity determination (cathode mark).

Furthermore, as mentioned above, the semiconductor device 40 of this embodiment is a so-called top view (top emission) type of LED in which the semiconductor element 45 attached to the upper surface emits light, just as in Embodiment 2 above.

Therefore, relative positional deviation between the first resin molded body 42 and the second resin molded body 43 in the left and right direction shown in FIG. 9A, etc., can lead to variance in the length of the terminals formed by bending the leads 41a and 41b, and there is the risk that there will be a difference in height between the left and right terminals, which may cause problems such as variance in the orientation of the light emitting surface in substrate mounting. Therefore, in this embodiment, management of positional deviation in the left and right direction in the drawing is particularly important.

Embodiment 4

A semiconductor device 50 according to yet another embodiment of the present invention will now be described with reference to FIGS. 10A to 11B.

The semiconductor device 50 in this embodiment differs from the semiconductor devices 10, 30, and 40 in Embodiments 1 to 3, in which the first resin molded body and the second resin molded body are formed by injection molding, in that a first resin molded body 52 and a second resin molded body 53 are transfer-molded LEDs that have been molded by transfer molding.

Figure 10A:
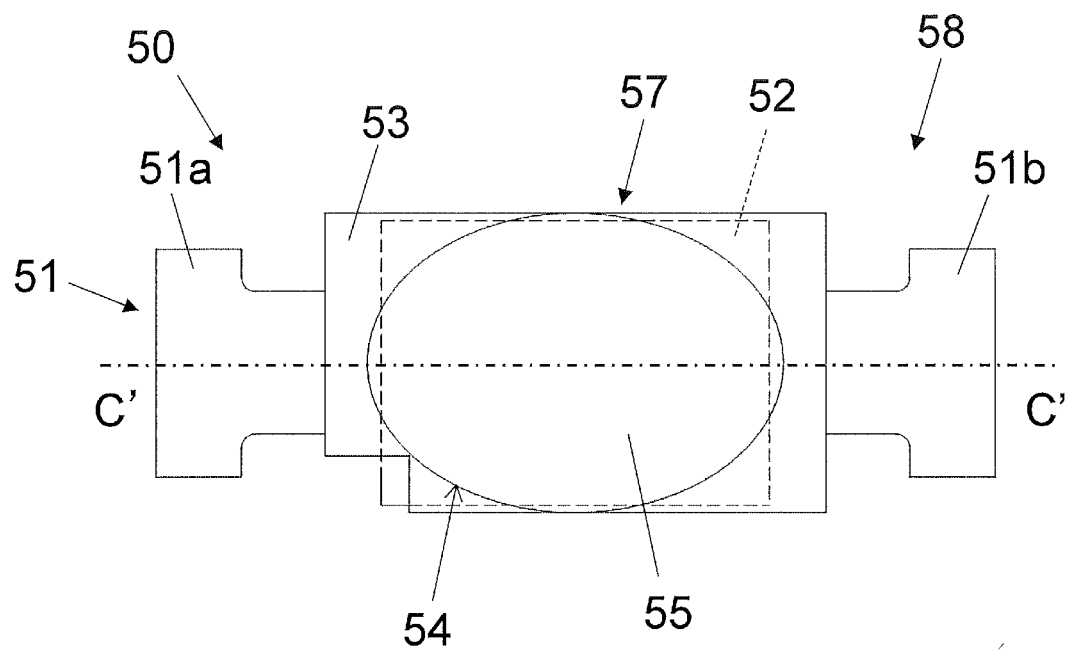
FIG. 10A is a plan view of the configuration of the cavity side of the semiconductor device according to a fourth embodiment of the present invention.
Figure 10B:
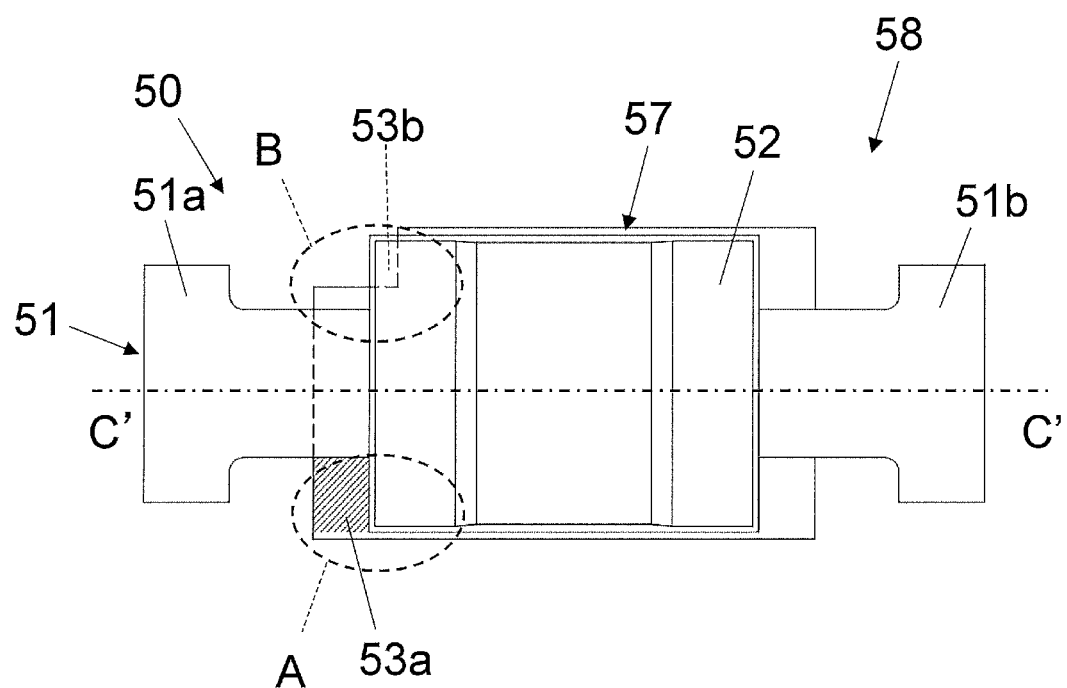
FIG. 10B is a plan view of the configuration on the gate side of the semiconductor device according to the fourth embodiment.

As shown in FIGS. 10A and 10B, the semiconductor device 50 in this embodiment mainly includes a semiconductor element 55 (not shown) and a package 58 having two leads 51a and 51b functioning as a pair of positive and negative electrodes and a resin molded body 57 that integrally holds the leads 51a and 51b. The resin molded body 57 has a lens 54.

The semiconductor element 55 has substantially the same function as the semiconductor element 15 in Embodiment 1, and therefore will not be described in detail here.

Also, although not shown in FIG. 10A, etc., the recess in which the semiconductor element 55 is attached shall be assumed to be disposed at the position included by the lens 54. Recesses are provided to the leads 51a and 51b themselves.

The resin molded body 57 has the second resin molded body 53 that is formed on the second surface (upper surface) side of the leads 51a and 51b (the lead frame 51 in the manufacturing process), and the first resin molded body 52 formed on the first surface (lower surface) side (gate side) of the leads 51a and 51b (the lead frame 51 in the manufacturing process).

The first resin molded body 52 and the second resin molded body 53 are integrally formed so as to sandwich the first surface and the second surface of the two leads 51a and 51b. The inner side surface of the recess of the package 58 consists of the lead 51a or the lead 52a.

The semiconductor element 55 is disposed on the bottom of a recess and is electrically connected to the leads 51a and 51b by wires or the like. Parts of the leads 51a and 51b extend to the outside of the resin molded body 57 and function as terminals.

As shown in FIGS. 10A and 10B, with this semiconductor device 50, a package group is prepared in which a plurality of packages 58 having recesses are disposed at specific positions, and semiconductor elements 55, etc., are attached in the recesses, and the group is finally separated into units.

In the group of packages 58, a plurality of resin molded bodies 57 are disposed in a matrix.

As shown in FIGS. 10A and 10B, the outer shape of the first resin molded body 52 is substantially rectangle in plan view, and the first resin molded body 52 is disposed in left and right symmetry with respect to the center axis C'-C'.

In FIGS. 10A and 10B, the center axis C'-C' is disposed in the left and right direction.

As shown in FIGS. 10A and 10B, the outer shape of the second resin molded body 53 is in left and right asymmetry with respect to the center axis C'-C' in plan view. More specifically, the second resin molded body 53 is different in that in the case where the A and B portions in FIG. 10B are compared, a cutout is provided in the A portion.

Consequently, in the case where viewed from the first resin molded body 52 side, the overlapping portion of the first resin molded body 52 and the second resin molded body 53 looks different on the left and right. That is, in the case where the A portion and the B portion are compared, as shown in FIG. 10B, in the A portion there is a portion where part of the second resin molded body 53 can be seen (a first determination component 53a), and in the B portion there is a portion where the second resin molded body 53 cannot be seen (a second determination component 53b).

FIG. 10B shows the state in the case where the first resin molded body 52 and the second resin molded body 53 are disposed in their proper positions.

With the semiconductor device 50 in this embodiment, as shown in FIG. 10B, in the case where the first resin molded body 52 and the second resin molded body 53 are disposed in their proper positions so as to sandwich the leads 51a and 51b (the lead frame 51 in the manufacturing process), viewed from the first resin molded body 52 side, one of the left and right ends of the second resin molded body 53 centered on the center axis C'-C' (the first determination component 53a) can be seen, and the other (the second determination component 53b) cannot be seen.

That is, in order to detect whether or not there is any relative positional deviation between the first resin molded body 52 and the second resin molded body 53, the second resin molded body 53 has the first determination component 53a and the second determination component 53b at the left and right ends centering on the center axis C'-C'.

The lens 54 is provided to the upper surface of the second resin molded body 53, that is, to a surface of the second resin molded body 53 that is substantially parallel to the leads 51a and 51b (the lead frame 51 in the manufacturing process).

Confirmation of Relative Positional Deviation Between First Resin Molded Body 52 and Second Resin Molded Body 53

As described above, with the semiconductor device 50 in this embodiment, the outer shape of the first resin molded body 52 is in left and right symmetry around the center axis C'-C', and the outer shape of the second resin molded body 53 is in left and right asymmetry around the center axis C'-C', to make it easy to check for relative positional deviation between the first resin molded body 52 and the second resin molded body 53 disposed so as to sandwich the leads 51a and 51b (the lead frame 51 in the manufacturing process).

Therefore, in the case where the first resin molded body 52 and the second resin molded body 53 are molded in their proper positions, as shown in FIG. 10B, viewed from the first resin molded body 52 side, in the A portion the first determination component 53a (the hatched portion in the drawing) of the second resin molded body 53 can be seen, and in the B portion the second determination component 53b is hidden by the first resin molded body 52 and cannot be seen.

Here, the A and B portions are boundary portions between the first resin molded body 52 and the second resin molded body 53 and the lead 51a functioning as a terminal, and serve as starting points for the bending of the lead 51a. Therefore, it is particularly important to accurately manage the size (length) of the terminal formed by bending the lead 51a in the A and B portions.

Figure 11A:
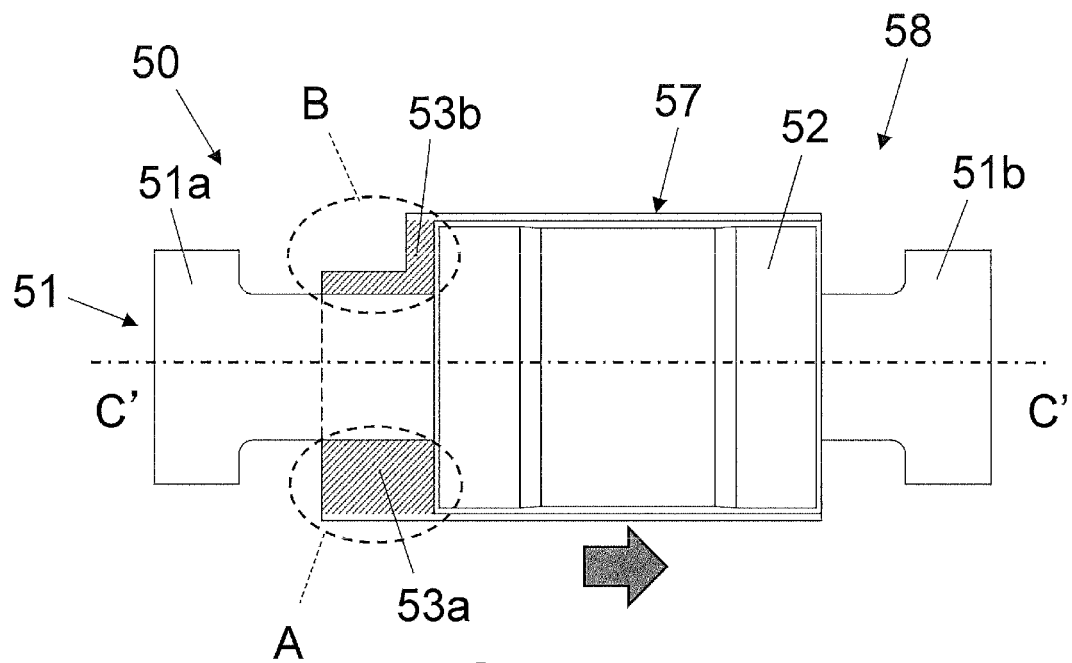
FIG. 11A is a plan view showing a state in which the first resin molded body on the gate side has shifted to the right from the state in FIG. 101B.

On the other hand, in the case where the first resin molded body 52 is molded so as to be displaced to the right side in the drawing (see the arrow) with respect to the second resin molded body 53, as shown in FIG. 11A, viewed from the first resin molded body 52 side, in the A portion the first determination component 53a (the hatched portion in the drawing) of the second resin molded body 53 is plainly visible, and in the B portion the second determination component 53b (the hatched portion in the drawing) is also visible.

Therefore, in the proper positions, the first determination component 53a is visible in the A portion and the second determination component 53b is not visible in the B portion, but in the case where a state in which the second determination component 53b is visible in the B portion is detected, this makes it easy to determine that there is relative positional deviation between the first resin molded body 52 and the second resin molded body 53.

Figure 11B:
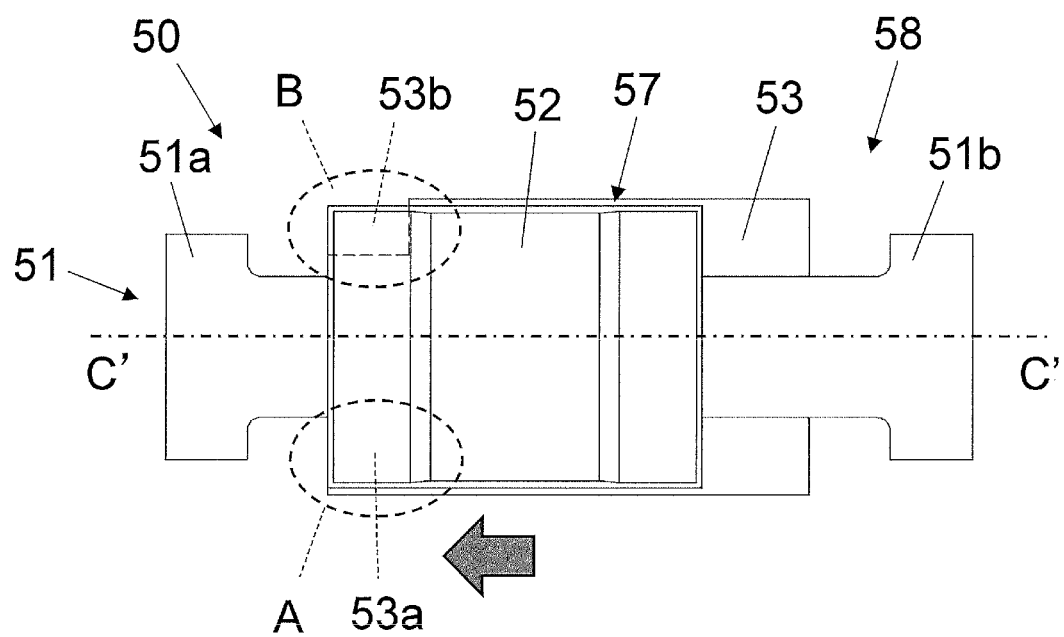
FIG. 11B is a plan view showing a state in which the first resin molded body on the gate side has shifted to the left from the state in FIG. 10B.

Furthermore, in the case where the first resin molded body 52 is molded so as to be displaced to the left side (see the arrow) with respect to the second resin molded body 53, as shown in FIG. 11B, viewed from the first resin molded body 52 side, in the A portion the first determination component 53a of the second resin molded body 53 cannot be seen, and in the B portion the second determination component 53b also cannot be seen.

For this reason, in the proper positions, in the A portion the first determination component 53a can be seen, and in the B portion the second determination component 53b cannot be seen, but in the case where a state is detected in which neither the first determination component 53a in the A portion nor the second determination component 53b in the B portion is visible, this makes it easy to determine that there is relative positional deviation between the first resin molded body 52 and the second resin molded body 53.

With the semiconductor device 50 in this embodiment, as described above, in the case where the first resin molded body 52 disposed on the gate side is in the proper position, in the case where the second resin molded body 53 disposed on the cavity side in the vicinity of the lead 51a functioning as a terminal is viewed from the gate side, the A portion (first determination component 53a) of the second resin molded body 53 is not hidden by the first resin molded body 52 and can be seen. On the other hand, the B portion (the second determination component 53b) of the second resin molded body 53 is hidden by the first resin molded body 52 and cannot be seen.

That is, in this embodiment, in the case where the first resin molded body 52 and the second resin molded body 53 are molded in their proper positions, a state in which the first determination component 53a in the A portion can be seen and the determination component 53b in the B portion cannot be seen is used as a reference for the proper position.

Consequently, a change from this reference state, such as a state in which the first determination component 53a of the A portion cannot be seen, or in which the second determination component 53b of the B portion can be seen, can be detected, which makes it easy to determine whether there is any relative positional deviation between the first resin molded body 52 and the second resin molded body 53.

Also, with the semiconductor device 50 in this embodiment, the upper die 22 and the lower die 21 constituting the molding die 20 are such that the shape of the upper die 22 disposed on the opposite side from the lower die 21 on the gate side, which serves as the bending start point of the leads 51a, 51b functioning as a terminal, is in left and right asymmetry (shape offset).

Consequently, as described above, it is possible to provide the semiconductor device 50 with which relative positional deviation between the first resin molded body 52 and the second resin molded body 53 can be easily detected and managed.

As in Embodiment 1 above, the left and right asymmetry of the second resin molded body 53 provided for positional deviation detection and determination may be used as a mark (cathode mark) for polarity determination.

Furthermore, as described above, the semiconductor device 50 in this embodiment is a transfer molded type of LED.

Therefore, the relative positional deviation between the first resin molded body 52 and the second resin molded body 53 in the left and right direction in FIG. 11A, etc., leads to variance in the length of the leads 51a and 51b functioning as terminals, and may be a factor in causing a difference in height between the left and right terminals, variance in the orientation of the light emitting surface during substrate mounting, and other such problems. Thus, management of positional deviation in the left and right direction in the drawing is particularly important in this embodiment.

Method for Manufacturing Semiconductor Device 50

Figure 12:
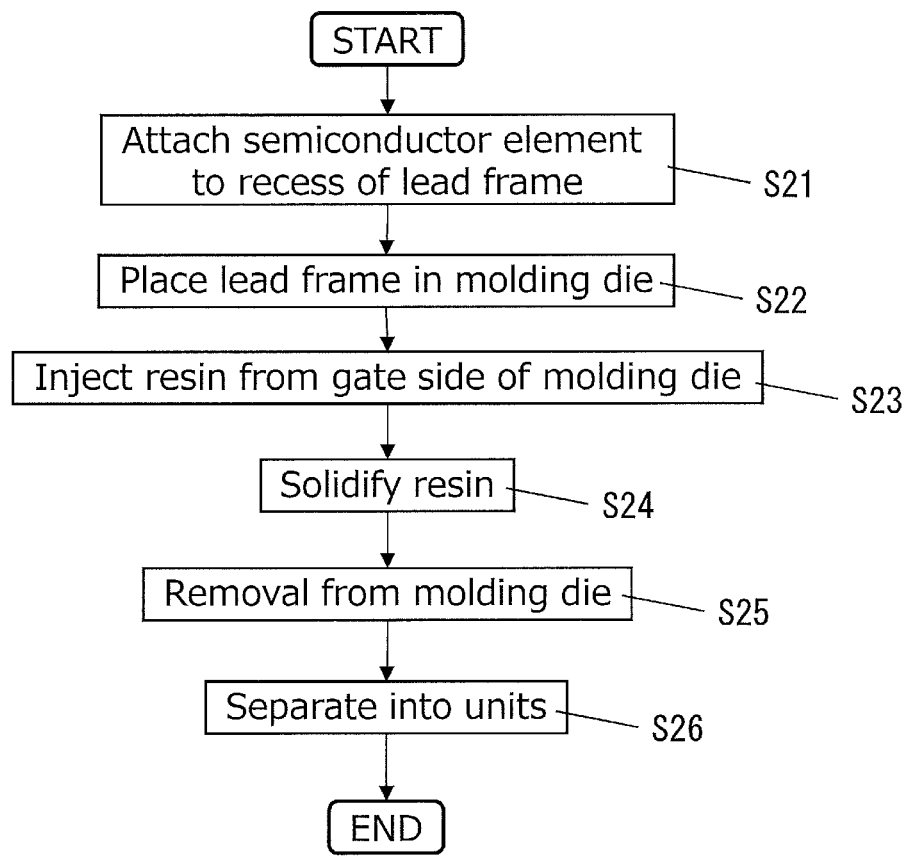
FIG. 12 is a flowchart showing a method for manufacturing the semiconductor device in FIG. 10A.

With the method for manufacturing the semiconductor device 50 in this embodiment, the above-mentioned transfer molded type of semiconductor device 50 is manufactured according to the flowchart shown in FIG. 12.

That is, as described above, the semiconductor device 50 in this embodiment is such that in order to easily detect relative positional deviation between the first resin molded body 52 and the second resin molded body 53, which are molded so as to sandwich the lead frame 51 from above and below using the molding die 20 shown in FIG. 4, in plan view, the outer shape of the first resin molded body 52 is formed in left and right symmetry around the center axis C-C, and the outer shape of the second resin molded body 53 is formed in left and right asymmetry around the center axis C-C.

More specifically, in step S21 a semiconductor element is attached to the recess of the lead frame 51.

Next, in step S22 the lead frame 51 is placed at a specific position in the molding die 20 (lower die 21) (see FIG. 3).

Next, in step S23 the lower die 21 and the upper die 22 of the molding die 20 are closed, after which resin is injected from the gate 21a of the lower die 21 into the molding die 20.

Next, in step S24, after the injection of the resin from the gate 21a of the lower die 21 is complete, the molding die 20 is cooled to solidify the injected resin, for example.

Next, in step S25 the first resin molded body 52 and the second resin molded body 53 molded in a state of being integrated with the lead frame 51 are taken out of the molding die 20.

Next, in step S26 the individual semiconductor elements 55 are cut away from the lead frame 51 into units.

With the semiconductor device 50 in this embodiment, in the above steps, in plan view, the outer shape of the first resin molded body 52 is formed in left and right symmetry around the center axis C'-C', and the outer shape of the second resin molded body 53 is formed in left and right asymmetry around the center axis C'-C'.

Consequently, a semiconductor device 50 can be manufactured with which relative positional deviation between the first resin molded body 52 and the second resin molded body 53 can be easily detected.

Other Embodiments

Embodiments of the present invention were described above, but the present invention is not limited to or by these embodiments, and various modifications are possible in a range which does not depart from the gist of the invention.

(A)

In the above embodiments, an example was given in which two determination components (a first determination component and a second determination component) were provided to a second resin molded body in left and right asymmetry in order to detect relative positional deviation between the first resin molded body and the second resin molded body. However, the present invention is not limited to this.

For instance, the determination components used to determine positional deviation are not limited to two as in Embodiments 1 to 4, and instead just one may be used, or three or more may be used.

(B)

In the above embodiments, an example was given in which, in the proper positions serving as a reference, the first determination component was visible and the second determination component was not visible, and this made it possible for even the direction of positional deviation to be specified between the first resin molded body and the second resin molded body. However, the present invention is not limited to this.

For instance, in the case where it is not necessary to specify the direction of positional deviation, the first determination component and the second determination component may both be visible at the proper positions serving as a reference, or neither the first determination component nor the second determination component may be visible.

(C)

In the above embodiments, an example was given in which the semiconductor device was such that a semiconductor element was placed on the side of the second resin molded body that was molded in left and right asymmetry around the center axis. However, the present invention is not limited to this.

For instance, the configuration may be such that a semiconductor element is placed on the side of the first resin molded body that is molded in left and right symmetry.

(D)

In the above embodiments, an example was given of a semiconductor device in which a gate mark for injecting the resin was provided on the side of the first resin molded body that was molded in left and right symmetry around the center axis has been described as an example. However, the present invention is not limited to this.

For instance, the gate mark may be provided on the side of the second resin molded body that is molded in left and right asymmetry.

(E)

In the above embodiments, an example was given of the configuration of a semiconductor device in which the leads 11a and 11b, etc., were bent and used as terminals. However, the present invention is not limited to this.

For instance, the present invention may be applied to a semiconductor device having a configuration in which leads are not bent as terminals.

(F)

In the above embodiments, an LED or other such light-emitting device was given as an example of a semiconductor device to which this invention is applied. However, the present invention is not limited to this.

For instance, the present disclosure can be broadly applied to semiconductor devices including a first resin molded body and a second resin molded body disposed on both surfaces of a lead frame.

The semiconductor device of the present disclosure has the effect of allowing relative positional deviation between resin molded bodies disposed so as to sandwich a lead frame to be easily detected, and therefore can be broadly applied to semiconductor devices that include lead frames.

The invention claimed is:

1. A semiconductor device comprising:
   a lead that is a thin metal plate having a first surface and a second surface on an opposite side from the first surface;
   a semiconductor element fixed to the lead;
   a first resin molded body arranged on the first surface of the lead, an outer shape of the first resin molded body being left and right symmetric with respect to a center axis passing through a center of the first resin molded body in a plan view; and
   a second resin molded body arranged on the second surface of the lead so that the lead is fixed between the first resin molded body and the second resin molded body, an outer shape of the second resin molded body being left and right asymmetric with respect to a center axis passing through a center of the second resin molded body in the plan view, the second resin molded body including
   a first determination component located at a portion of a connecting face where the first resin molded body and the second resin molded body are connected to each other, the first determination component being exposed from the first resin molded body when viewed from a side of the first resin molded body in the plan view; and
   a second determination component located at a portion of the connecting face, the second determination component being not exposed from the first resin molded body when viewed from the side of the first resin molded body in the plan view.

2. The semiconductor device according to claim 1, wherein
   the first resin molded body has a gate mark.

3. The semiconductor device according to claim 1, wherein
   the second resin molded body defines a recess in which the semiconductor element is placed.

4. The semiconductor device according to claim 3, wherein
   the recess opens on a side surface of the semiconductor device.

5. The semiconductor device according to claim 3, wherein
   the recess opens on an upper surface of the semiconductor device.

6. The semiconductor device according to claim 1, wherein
   the lead further has a terminal configured to be connected to external wiring.

7. A method for manufacturing the semiconductor device according to claim 1, the method comprising:
   setting a lead frame in a die;
   injecting a resin into the die; and
   curing the resin to form the first resin molded body and the second resin molded body.

8. The method for manufacturing the semiconductor device according to claim 7, wherein
   the first resin molded body and the second resin molded body are molded by injection molding or transfer molding.

* * * * *